(12) United States Patent
Hayakawa

(10) Patent No.: US 10,244,271 B2
(45) Date of Patent: Mar. 26, 2019

(54) AUDIO RECORDING DEVICE, AUDIO RECORDING SYSTEM, AND AUDIO RECORDING METHOD

(71) Applicant: SONY SEMICONDUCTOR SOLUTIONS CORPORATION, Kanagawa (JP)

(72) Inventor: Tomonobu Hayakawa, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 0 days.

(21) Appl. No.: 15/580,325

(22) PCT Filed: May 9, 2016

(86) PCT No.: PCT/JP2016/063754
§ 371 (c)(1),
(2) Date: Dec. 7, 2017

(87) PCT Pub. No.: WO2016/203866
PCT Pub. Date: Dec. 22, 2016

(65) Prior Publication Data
US 2018/0167649 A1 Jun. 14, 2018

(30) Foreign Application Priority Data

Jun. 17, 2015 (JP) ................................. 2015-122214

(51) Int. Cl.
*H03M 7/00* (2006.01)
*H04N 21/233* (2011.01)
(Continued)

(52) U.S. Cl.
CPC ......... *H04N 21/2335* (2013.01); *G10L 19/02* (2013.01); *G10L 21/04* (2013.01);
(Continued)

(58) Field of Classification Search
CPC ..... G10L 13/033; G10L 15/22; G10L 15/265; G10L 17/22; G10L 19/24;
(Continued)

(56) References Cited

U.S. PATENT DOCUMENTS 5,173,900 A * 12/1992 Miller ........................ H04J 3/16
348/E7.056
5,911,128 A * 6/1999 DeJaco .................... G10L 19/18
704/200.1

(Continued)

FOREIGN PATENT DOCUMENTS

AR          77680 A1     9/2011
AU      2010280971 A1    2/2012
(Continued)

OTHER PUBLICATIONS

International Search Report and Written Opinion of PCT Application No. PCT/JP2016/063754, dated Jul. 12, 2016, 10 pages of ISRWO.

*Primary Examiner* — Linh Nguyen
(74) *Attorney, Agent, or Firm* — Chip Law Group

(57) ABSTRACT

Deterioration in audio quality is inhibited in a device which records audio and stretches a reproduction time period. A sampling processing unit performs processing of sampling audio in a predetermined period at a sampling rate higher than a predetermined sampling rate to generate audio data as high-resolution audio data, and processing of sampling audio outside the predetermined period at the predetermined sampling rate to generate audio data as normal audio data. Also, a reproduction time conversion unit stretches the reproduction time period of the high-resolution audio data.

20 Claims, 32 Drawing Sheets

(51) Int. Cl.
*H04N 5/91* (2006.01)
*G10L 19/02* (2013.01)
*H03M 1/06* (2006.01)
*G10L 21/04* (2013.01)
*H04N 5/76* (2006.01)
*H04N 9/802* (2006.01)
*H04N 9/82* (2006.01)
*H03H 17/06* (2006.01)

(52) U.S. Cl.
CPC ............... *H03M 1/06* (2013.01); *H04N 5/76* (2013.01); *H04N 5/91* (2013.01); *H04N 9/802* (2013.01); *H04N 9/8205* (2013.01); *H04N 21/233* (2013.01); *H03H 17/0628* (2013.01); *H03H 17/0685* (2013.01)

(58) Field of Classification Search
CPC ... G10L 2015/088; H03M 3/366; H03M 3/43; H03M 3/448; H03M 3/45; H03M 3/454; H04N 21/23406; H04N 21/2368; H04N 21/4307; H04N 21/04
USPC .......................................... 341/61; 381/122
See application file for complete search history.

(56) References Cited

U.S. PATENT DOCUMENTS

| | | | | |
|---|---|---|---|---|
| 6,052,241 A * | 4/2000 | Teranishi | ............. | G11B 5/0086 360/13 |
| 6,393,199 B1 * | 5/2002 | Lemke | ................. | G11B 5/0086 386/205 |
| 6,438,518 B1 * | 8/2002 | Manjunath | .............. | G10L 19/02 704/219 |
| 6,526,217 B1 * | 2/2003 | Fujinami | ................ | G11B 20/10 360/13 |
| 6,584,272 B1 * | 6/2003 | Fukushima | .............. | H04N 5/76 386/230 |
| 6,754,354 B1 * | 6/2004 | Lokhoff | ........... | G11B 20/00086 340/4.37 |
| 8,352,252 B2 | 1/2013 | Fang | ..................... | H04L 1/0009 704/219 |
| 9,263,054 B2 * | 2/2016 | Subasingha | ............. | G10L 19/12 |
| 9,923,653 B2 * | 3/2018 | Ise | ........................ | H04H 40/18 |
| 2001/0032072 A1 | 10/2001 | Inoue | | |
| 2003/0220783 A1 * | 11/2003 | Streich | ..................... | G10L 19/24 704/200.1 |
| 2005/0177364 A1 * | 8/2005 | Jelinek | ..................... | G10L 19/20 704/214 |
| 2006/0074642 A1 * | 4/2006 | You | ........................ | G10L 19/025 704/222 |
| 2007/0124141 A1 * | 5/2007 | You | ........................ | G10L 19/025 704/230 |
| 2007/0171931 A1 * | 7/2007 | Manjunath | .............. | G10L 19/22 370/435 |
| 2010/0329630 A1 * | 12/2010 | Henry | .............. | H04N 21/23406 386/201 |
| 2012/0128151 A1 | 5/2012 | Boehm et al. | | |
| 2012/0148063 A1 | 6/2012 | Kajimura et al. | | |
| 2012/0303362 A1 * | 11/2012 | Duni | ....................... | G10L 19/22 704/219 |
| 2014/0126751 A1 * | 5/2014 | Yliaho | ..................... | H04R 3/00 381/122 |
| 2016/0012828 A1 * | 1/2016 | Chatlani | .............. | G10L 21/0232 704/205 |

FOREIGN PATENT DOCUMENTS

| | | |
|---|---|---|
| CA | 2768327 A1 | 2/2011 |
| CN | 102568492 A | 7/2012 |
| CN | 102576559 A | 7/2012 |
| EP | 2462587 A1 | 6/2012 |
| IL | 217469 A | 2/2015 |
| JP | 08-171779 A | 7/1996 |
| JP | 2001-255894 A | 9/2001 |
| JP | 2003-255995 A | 9/2003 |
| JP | 2009-289385 A | 12/2009 |
| JP | 2010-178124 A | 8/2010 |
| JP | 2011-250339 A | 12/2011 |
| JP | 2012-129652 A | 7/2012 |
| JP | 2013-500655 A | 1/2013 |
| JP | 2014-228691 A | 12/2014 |
| JP | 2016-048810 A | 4/2016 |
| KR | 10-2012-0050446 A | 5/2012 |
| MX | 2012001558 A | 4/2012 |
| RU | 2012107995 A | 9/2013 |
| SG | 177605 A1 | 2/2012 |
| TW | 201134135 A | 10/2011 |
| WO | 2014/115522 A1 | 7/2014 |

\* cited by examiner

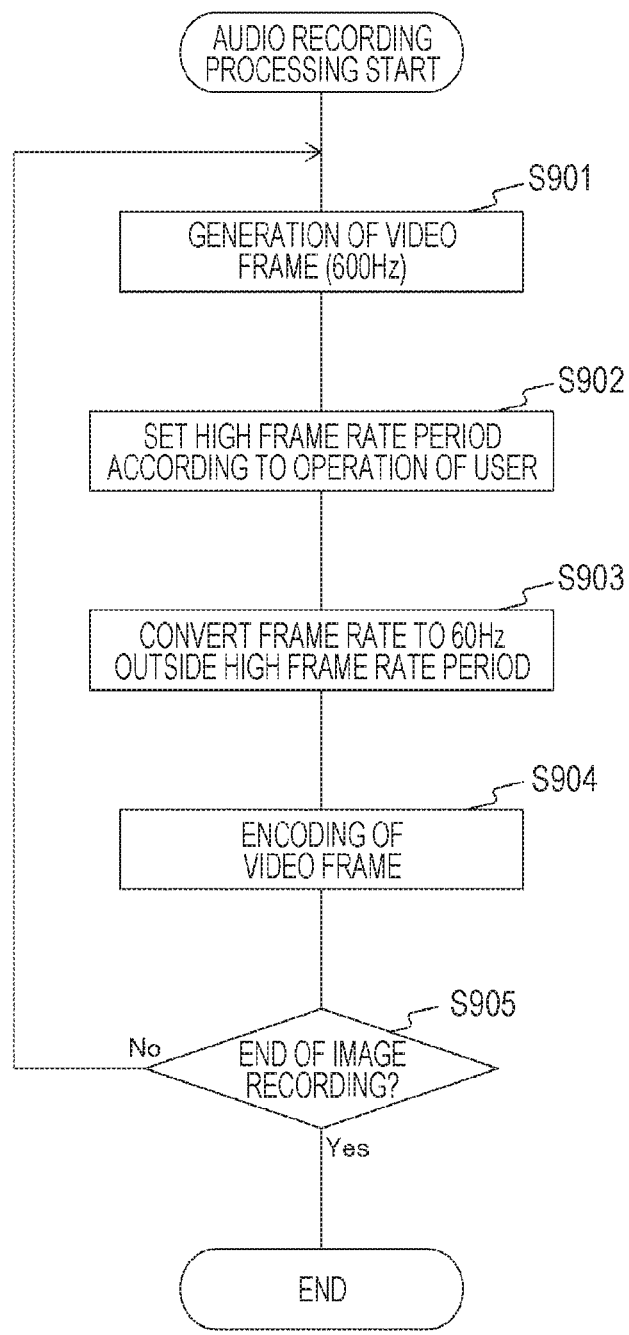

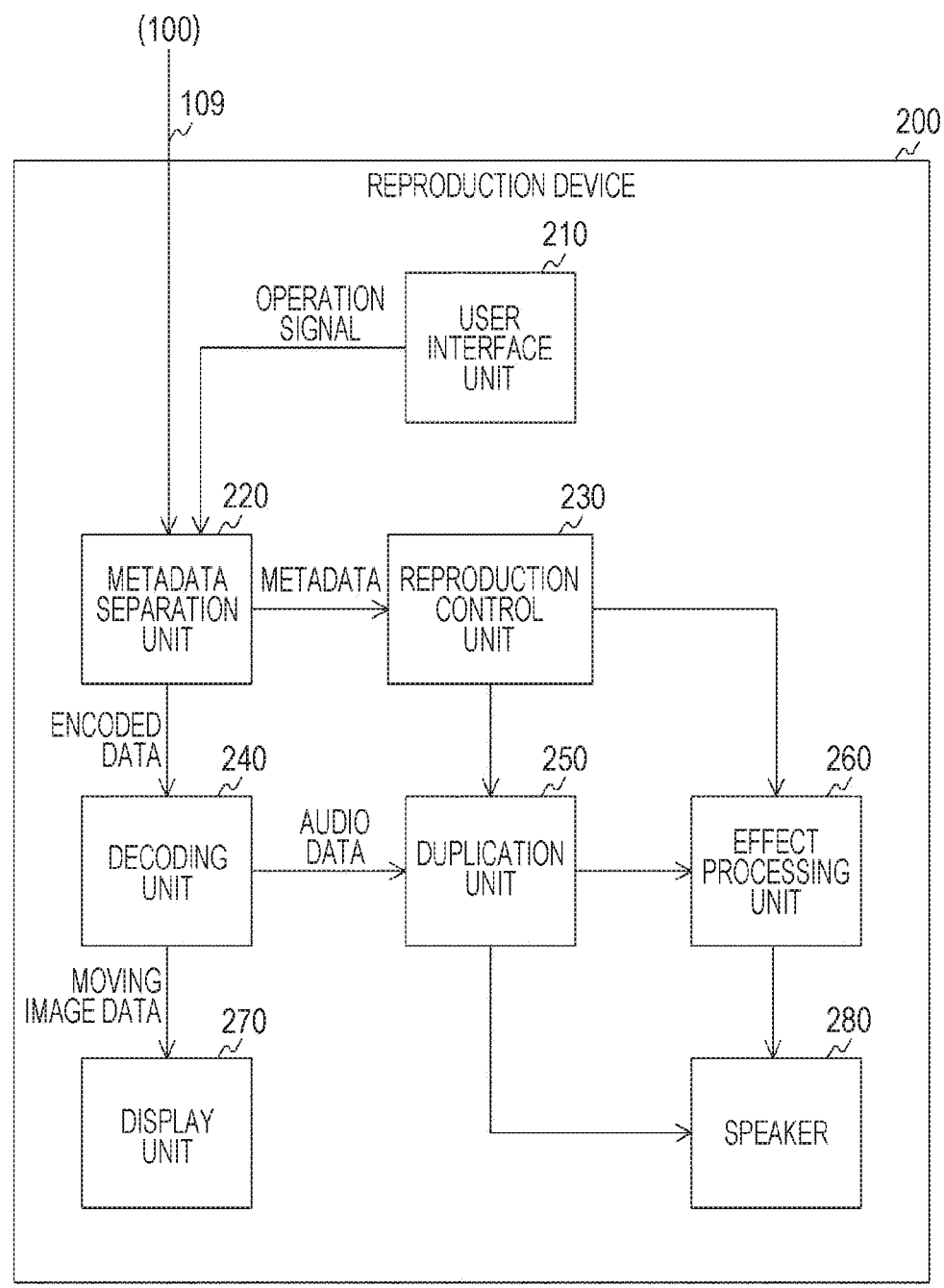

| Syntax | No. of bits | Mnemonic |
|---|---|---|
| raw_data_block() <br> { <br>   while((id=id_syn_ele)!=ID_END){ <br>     switch(id){ <br>       case ID_SCE: single_channel_element(); <br>         break; <br>       case ID_CPE: channel_pair_element(); <br>         break; <br>       case ID_CCE: coupling_channel_element(); <br>         break; <br>       case ID_LFE: lfe_channel_element(); <br>         break;     511 <br>       case ID_DSE: data_stream_element(); <br>         break; <br>       case ID_PCE: program_config_element(); <br>         break; <br>       case ID_FIL: fill_element(); <br>     } <br>   } <br>   byte_alignment(); <br> } | 3 | uimsbf |

| Moov | | | | | | * | 13.2.3.1 | container for all the meta-data |
|---|---|---|---|---|---|---|---|---|
| | mvhd | | | | | * | 13.2.3.3 | movie header, overall declarations |
| | iods | | | | | * | 13.2.3.4 | object descriptor |
| | trak | | | | | * | 13.2.3.4.2 | container for an individual track or stream |
| | | tkhd | | | | * | 13.2.3.6 | track header, overall information about the track |
| | | tref | | | | | 13.2.3.7 | track reference container |
| | | edts | | | | | 13.2.3.25 | edit list container |
| | | | elst | | | | 13.2.3.26 | an edit list |
| | | mdia | | | | * | 13.2.3.8 | container for the media information in a track |
| | | | mdhd | | | * | 13.2.3.9 | media header, overall information about the media |
| | | | hdlr | | | | 13.2.3.10 | handler at this level, the media (handler) type |
| | | | minf | | | * | 13.2.3.11 | media information container |
| | | | | vmhd | | | 13.2.3.12.1 | video media header, overall information (video track only) |
| | | | | smhd | | | 13.2.3.12.2 | sound media header, overall information (sound track only) |
| | | | | hmhd | | | 13.2.3.12.3 | hint media header, overall information (hint track only) |
| | | | | <mpeg> | | | 13.2.3.12.4 | mpeg stream headers |
| | | | | dinf | | * | 13.2.3.13 | data information atom, container |
| | | | | | dref | * | 13.2.3.14 | data reference atom, declares source(s) of media in track |
| | | | | stbl | | * | 13.2.3.15 | sample table atom, container for the time/space map |
| | | | | | stts | * | 13.2.3.16.1 | (decoding) time-to-sample |
| ⋮ | ⋮ | ⋮ | ⋮ | ⋮ | ⋮ | ⋮ | ⋮ | ⋮ |
| mdat | | | | | | | 13.2.3.2 | Media data container |
| free | | | | | | | 13.2.3.24 | free space |
| skip | | | | | | | 13.2.3.24 | free space |
| udta | | | | | | | 13.2.3.27 | user-data, copyright etc. |

| Box Types | | | | | | * | Reference | Description |
|---|---|---|---|---|---|---|---|---|
| ftyp | | | | | | * | | file type and compatibility |
| uuid | | | | | | * | 2. 4. 18. 1 | private extension ('PROF'); file profile |
| moov | | | | | | * | | container for all the movie resources |
| | mvhd | | | | | * | | movie header, overall declarations |
| | iods | | | | | | *3 | container for an initial object descriptor |
| | trak | | | | | * | | container for an individual track or stream |
| | | tkhd | | | | * | | track header, overall information about the track |
| | | tref | | | | | | track reference container |
| | | | sync | | | | | synchronization indication |
| | | | mpod | | | | | OD track indication |
| | | edts | | | | * | | edit list container |
| | | | elst | | | | * | an edit list |
| | | mdia | | | | * | | container for the media information in a track |
| | | | mdhd | | | | * | media header, overall information about the media |
| | | | hdlr | | | | * | media header, the media (handler) type |
| | | | minf | | | | * | media information container |
| | | | | vmhd | | | *2 | video media header, (video track only) |
| | | | | smhd | | | *2 | sound media header, (audio track only) |
| | | | | nmhd | | | *2 | null media header, (some tracks only) |
| | | | | dinf | | | * | data information container |
| | | | | | dref | | * | data reference, declares source(s) of media in track |
| | | | | | | url | * | URL reference entry |
| | | | | stbl | | | * | sample table, container for the time/space map |
| ⋮ | ⋮ | ⋮ | ⋮ | ⋮ | ⋮ | ⋮ | ⋮ | ⋮  531 |
| | | uuid | | | | * | 2. 4. 18. 2 | private extension ('USMT'); user specific metadata |
| | | | MTDF | | | | 2. 4. 18. 3 | meta type definition list |
| | | | MTDT | | | * | 2. 4. 18. 4 | metadata list |

AUDIO RECORDING DEVICE, AUDIO RECORDING SYSTEM, AND AUDIO RECORDING METHOD

CROSS REFERENCE TO RELATED APPLICATIONS

This application is a U.S. National Phase of International Patent Application No. PCT/JP2016/063754 filed on May 9, 2016, which claims priority benefit of Japanese Patent Application No. JP 2015-122214 filed in the Japan Patent Office on Jun. 17, 2015. Each of the above-referenced applications is hereby incorporated herein by reference in its entirety.

TECHNICAL FIELD

The present technology relates to an audio recording device, an audio recording system, and an audio recording method. More specifically, this relates to an audio recording device, an audio recording system, and an audio recording method for changing a reproduction time period of audio data.

BACKGROUND ART

Conventionally, for the purpose of making audio easy to hear, processing of stretching the reproduction time period of the audio is performed. For example, an imaging device which, when reproducing a moving image slowly, stretches the reproduction time period of the audio recorded in synchronization with the moving picture is proposed (for example, refer to Patent Document 1).

CITATION LIST

Patent Document

Patent Document 1: Japanese Patent Application Laid-Open No. 2010-178124

SUMMARY OF THE INVENTION

Problems to be Solved by the Invention

However, with the above-described imaging device, an audio quality is deteriorated as the reproduction time period of the audio is lengthened. For example, if the reproduction time period is doubled, a frequency of the audio is decreased to ½ and a pitch is lowered by about one octave as compared to a case where the reproduction time period is not stretched. As described above, there is a problem that a difference in audio quality between the portion where the reproduction time period is stretched and the portion where this is not stretched becomes large, causing a sense of discomfort, and a reproduction quality of entire audio is deteriorated.

The present technology is achieved in view of such a situation, and an object thereof is to inhibit the deterioration in audio quality in a device which records audio and stretches the reproduction time period thereof.

Solutions to Problems

The present technology is achieved for solving the above-described problem and a first aspect thereof is an audio recording device and an audio recording method provided with a sampling processing unit configured to perform processing of sampling audio in a predetermined period at a sampling rate higher than a predetermined sampling rate to generate audio data as high-resolution audio data, and processing of sampling audio outside the predetermined period at the predetermined sampling rate to generate the audio data as normal audio data, and a reproduction time period conversion unit configured to stretch a reproduction time period of the high-resolution audio data. As a result, there is an effect that the reproduction time period of the high-resolution audio data sampled in the predetermined period at the sampling rate higher than the predetermined sampling rate is stretched.

Also, in the first aspect, the sampling processing unit may sample the audio at the predetermined sampling rate outside the predetermined period and switch the sampling rate to a sampling rate higher than the predetermined sampling rate to sample the audio in the predetermined period. As a result, there is an effect that the sampling rate is switched in the predetermined period.

Also, in the first aspect, the sampling processing unit may be provided with a high-resolution microphone which samples the audio at a sampling rate higher than the predetermined sampling rate to generate the high-resolution audio data, and a sampling rate converter which re-samples the high-resolution audio data at the predetermined sampling rate to generate the normal audio data outside the predetermined period. As a result, there is an effect that the normal audio data is generated by the re-sampling of the high-resolution audio data.

Also, in the first aspect, the sampling processing a may be provided with a high-resolution microphone which samples the audio at the sampling rate higher than the predetermined sampling rate to generate the high-resolution audio data, a normal microphone which samples the audio at the predetermined sampling rate to generate the normal audio data, and a selection unit which selects the high-resolution audio data to output in the predetermined period and selects the normal audio data to output outside the predetermined period. As a result, there is an effect that the high-resolution audio data is selected in the predetermined period, and the normal audio data is selected outside the predetermined period.

Also, in the first aspect, the selection unit may perform combining processing of combining the normal audio data with the high-resolution audio data in a constant fade period in the predetermined period. As a result, there is an effect that the normal audio data is combined with the high-resolution audio data in the constant fade period.

Also, in the first aspect, the selection unit may change a proportion of the high-resolution audio data each time a unit time period shorter than the fade period elapses in the combining processing. As a result, there is an effect that the proportion of the high-resolution audio data is changed each time the unit time period elapses.

Also, in the first aspect, an imaging unit configured to image a plurality of frames at a frame rate higher than a predetermined frame rate, and a frame rate conversion unit configured to convert a frame rate of a frame imaged outside the predetermined period out of the plurality of frames to the predetermined frame rate may be further provided. As a result, there is an effect that the frame rate of a plurality of frames imaged outside the predetermined period at the frame rate higher than the predetermined frame rate is converted to the predetermined frame rate.

Also, in the first aspect, a control unit configured to set a period including predetermined timing as the predetermined period may be further provided. As a result, there is an effect that the period including the predetermined timing is set as the predetermined period.

Also, in the first aspect, a scene change detection unit configured to detect scene change timing at which a scene changes out of the plurality of frames may be further provided, and the control unit may set a period including the scene change timing as the predetermined period. As a result, there is an effect that the period including the scene change timing is set as the predetermined period.

Also, in the first aspect, a sensor configured to detect a predetermined detection target may be further provided, and the control unit may set a period including timing at which the detection target is detected as the predetermined period. As a result, there is an effect that the period including the timing at which the detection target is detected is set as the predetermined period.

Also, in the first aspect, a signal processing unit configured to execute predetermined signal processing on the high-resolution audio data the reproduction time period of which is stretched may be further provided. As a result, there is an effect that the predetermined signal processing is executed on the high-resolution audio data.

Also, in the first aspect, the signal processing unit may duplicate the high-resolution audio data. As a result, there is an effect that the high-resolution audio data is duplicated.

Also, in the first aspect, the signal processing unit may adjust a volume level of the high-resolution audio data with a predetermined gain. As a result, there is an effect that the volume level of the high-resolution audio data is adjusted with the predetermined gain.

Also, in the first aspect, the signal processing unit may change a frequency characteristic of the high-resolution audio data. As a result, there is an effect that the frequency characteristic of the high-resolution audio data is changed.

Also, a second aspect of the present technology is an audio recording system provided with an audio recording device configured to perform processing of sampling audio in a predetermined period at a sampling rate higher than a predetermined sampling rate to generate audio data as high-resolution audio data, and processing of sampling audio outside the predetermined period at the predetermined sampling rate to generate audio data as normal audio data, and stretch a reproduction time period of the high-resolution audio data to generate metadata including setting information indicating signal processing which should be executed on the high-resolution audio data the reproduction time period of which is stretched, and a reproduction device configured to execute the signal processing according to the setting information and reproduce the high-resolution audio data on which the signal processing is executed and the normal audio data. As a result, there is an effect that the high-resolution audio data is selected in the predetermined period, and the normal audio data is selected outside the predetermined period.

Also, in the first aspect, a format of the metadata is MPEG4-AAC, and the audio recording device may record the setting information in a data stream element (DSE) area of the metadata. As a result, there is an effect that the setting information is recorded in the DSE area.

Also, in the second aspect, a format of the metadata is MPEG4-system, and the audio recording device may record the setting information in a udta area of the metadata. As a result, there is an effect that the above-described setting information is recorded in the udta area.

Also, in the second aspect, a format of the metadata is home and mobile multimedia platform (HMMP), and the audio recording device may record the setting information in a uuid area of the metadata. As a result, there is an effect that the above-described setting information is recorded in the uuid area.

Also, the second aspect of the present technology is an audio recording system provided with an audio recording device configured to perform processing of sampling audio in a predetermined period at a sampling rate higher than a predetermined sampling rate to generate audio data as high-resolution audio data, and processing of sampling audio outside the predetermined period at the predetermined sampling rate to generate audio data as normal audio data, and stretch a reproduction time period of the high-resolution audio data to generate metadata including setting information indicating signal processing which should be executed on the high-resolution audio data the reproduction time period of which is stretched, and an editing device configured to change the setting information to execute the signal processing indicated by the changed setting information. As a result, there is an effect that the high-resolution audio data is selected in the predetermined period, and the normal audio data is selected outside the predetermined period.

Effects of the Invention

According to the present technology, it is possible to exhibit an excellent effect that deterioration in audio quality may be inhibited in a device which records audio and stretches a reproduction time period. Meanwhile, the effects are not necessarily limited to the effects herein described and may be the effects described in the present disclosure.

BRIEF DESCRIPTION OF DRAWINGS

FIG. 9 is a flowchart illustrating an example of image recording processing in the first embodiment.

FIG. 20 is a block diagram illustrating a configuration example of a reproduction device in the third embodiment.

FIG. 21 is a view illustrating an example of a field to be set when MPEG4-AAC is used in the third embodiment.

FIG. 22 is a view illustrating an example of a field to be set when MPEG4-system is used in the third embodiment.

FIG. 23 is a view illustrating an example of a field to be set when a HMMP file format is used in the third embodiment.

MODE FOR CARRYING OUT THE INVENTION

Modes for carrying out the present technology (hereinafter, referred to as embodiments) are hereinafter described. The description is given in the following order.
1. First Embodiment (Example of Stretching Reproduction Time Period of High-Resolution Audio Data)
2. Second Embodiment (Example of Stretching Reproduction Time Period of High-Resolution Audio Data to Perform Signal Processing)
3. Third Embodiment (Example of Stretching Reproduction Time Period of High-Resolution Audio Data to Generate Metadata)
4. Fourth Embodiment (Example of Stretching Reproduction Time Period of High-Resolution Audio Data to Edit Metadata)
5. Fifth Embodiment (Example of Stretching Reproduction Time Period of High-Resolution Audio Data and Converting Sampling Rate of High-Resolution Audio Data)
6. Sixth Embodiment (Example of Combining Normal Audio Data with High-Resolution Audio Data to Stretch Reproduction Time Period)

Figure 1:
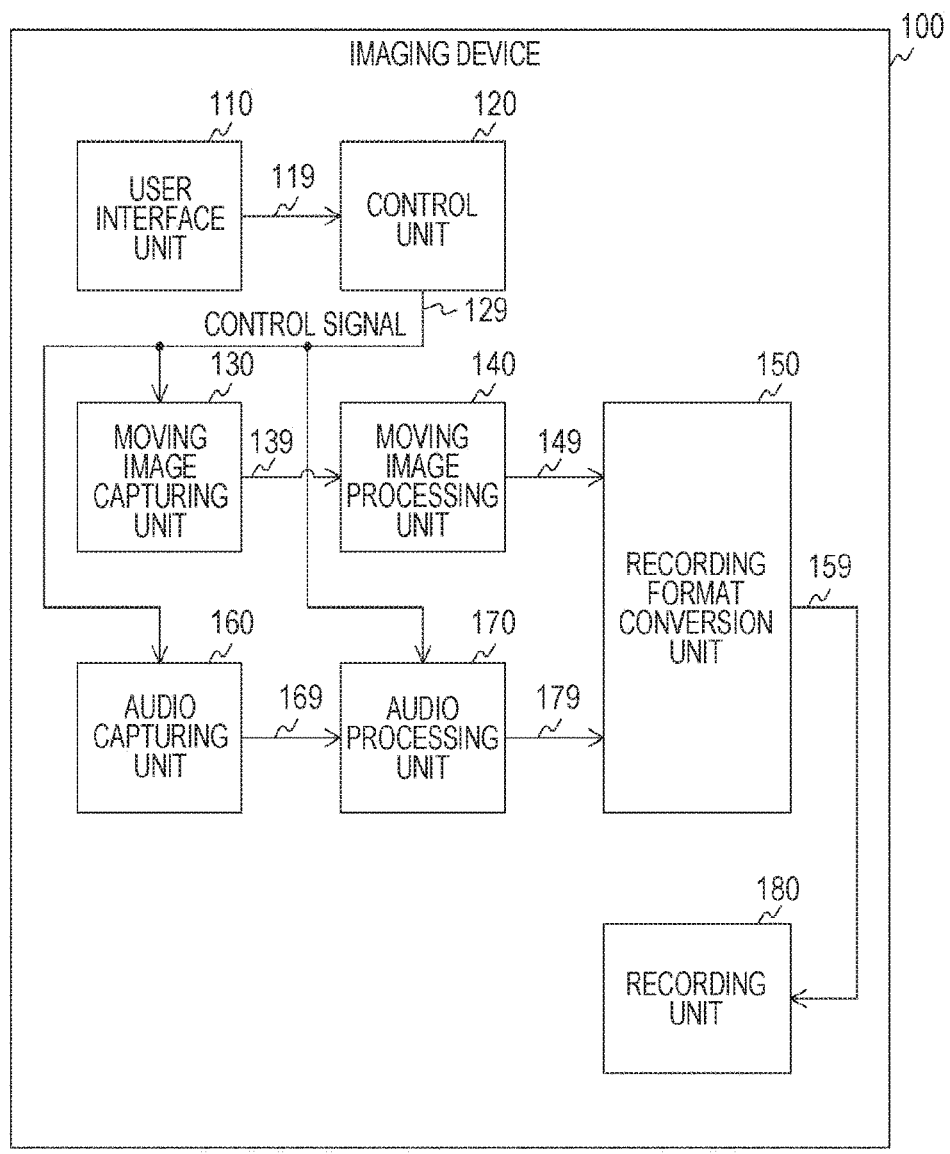
FIG. 1 is a block diagram illustrating a configuration example of an imaging device in a first embodiment.

<1. First Embodiment>
[Configuration Example of Imaging Device]
FIG. 1 is a block diagram illustrating a configuration example of an imaging device 100 in a first embodiment.

The imaging device 100 is a device which performs image recording and audio recording provided with a user interface unit 110, a control unit 120, a moving image capturing unit 130, a moving image processing unit 140, a recording format conversion unit 150, an audio capturing unit 160, an audio processing unit 170, and a recording unit 180. Meanwhile, the imaging device 100 is an example of an audio recording device recited in claims.

The user interface unit 110 generates an operation signal according to operation of a user. The user interface unit 110 supplies the generated operation signal to the control unit 120.

The control unit 120 controls an entire imaging device 100 according to the operation signal. The control unit 120 generates a control signal for controlling operation of the audio recording and image recording according to the operation signal. The control signal includes, for example, a signal indicating start timing and end timing of the image recording and the audio recording. It is assumed that the start timing of the image recording is the same as the start timing of the audio recording. Similarly, the end timing of the image recording is assumed to be the same as that of the audio recording. Also, the control signal further includes a signal indicating start timing and end timing of a high frame rate period.

Herein, the high frame rate period is a period in which imaging is performed at a frame rate higher than that at the time of reproduction. For example, a period of a constant length (such as one second) around timing at which the user presses a predetermined button is set as the high frame rate period. The frame rate outside the high frame rate period is the same as that at the time of reproduction. The frame rate outside the high frame rate period (at the time of reproduction) is set to 60 hertz (Hz), for example, and the frame rate in the high frame rate period is set to 600 hertz (Hz), for example.

Meanwhile, the frame rate at the time of reproduction is not limited to 60 hertz (Hz) and may be 30 hertz (Hz) and the like. Also, the frame rate in the high frame rate period is not limited to 600 hertz (Hz) as long as this is a value higher than that at the time of reproduction and may be 120 hertz (Hz) and the like.

The control unit 120 supplies the control signal indicating the above-described timing to the moving image capturing unit 130, the audio capturing unit 160, and the audio processing unit 170 via a signal line 129.

The moving image capturing unit 130 sequentially images a plurality of video frames according to the control signal. The moving image capturing unit 130 supplies moving image data including the imaged video frames in chronological order to the moving image processing unit 140 via a signal line 139.

The moving image processing unit 140 performs processing of encoding the moving image data. The moving image data is encoded, for example, according to Moving Picture Experts Group (MPEG)-2 standards. The moving image processing unit 140 packetizes the encoded moving image data into video packets and supplies the same to the recording format conversion unit 150 via a signal line 149. Meanwhile, the moving image processing unit 140 may encode according to the standards other than MPEG-2 such as MPEG-4.

The audio capturing unit 160 samples audio according to the control signal to generate audio data. The audio capturing unit 160 samples the audio at a predetermined sampling rate and quantizes a volume level of the audio into digital audio data at each sampling. A method of performing analog to digital (AD) conversion of analog signals by the sampling and quantization in this manner is referred to as a pulse code modulation (PCM) method.

The audio capturing unit 160 samples the audio in the high frame rate period at the sampling rate higher than that outside the high frame rate period. The sampling rate in the high frame rate period is set to 96 kilohertz (kHz), for example, and the sampling rate outside the high frame rate period is set to 48 kilohertz (kHz), for example. Hereinafter, the audio data sampled in the high frame rate period is referred to as "high-resolution audio data" and the audio data sampled outside the high frame rate period is referred to as "normal audio data". The audio capturing unit 160 supplies the audio data to the audio processing unit 170 via a signal line 169.

Meanwhile, the audio capturing unit 160 is an example of a sampling processing unit recited in claims. Also, the sampling rate outside the high frame rate period is not limited to 48 kilohertz (kHz) as long as this is a value lower than that in the high frame rate period and may be 44.1 kilohertz (kHz) and the like. Also, the sampling rate in the high frame rate period is not limited to 96 kilohertz (kHz) as long as this is a value higher than that outside the high frame rate period and may be 192 kilohertz (kHz) and the like.

The audio processing unit 170 stretches the reproduction time period of the high-resolution audio data at a constant scale factor (for example, two) according to the control signal. The audio processing unit 170 encodes the high-resolution audio data the reproduction time period of which is stretched and the normal audio data in a predetermined encoding unit. The audio data are encoded, for example, in a 20 milliseconds (ms) unit according to the MPEG standards. Each sound signal encoded in the encoding unit is referred to as an "audio frame". The audio processing unit 170 packetizes the audio frame into an audio packet and supplies the same to the recording format conversion unit 150 via a signal line 179.

The recording format conversion unit 150 converts recording formats of the video packet and the audio packet into predetermined formats. Also, the recording format conversion unit 150 sets reproduction time point for each of the audio frame and the video frame. A presentation time stamp (PTS) in the MPEG standards is set, for example, as the reproduction time point. The PTS of the video frame is set at the same interval (for example, 1/60 second) as an imaging interval of the video frames outside the high frame rate period. Also, the PTS of a first audio frame generated from the high-resolution audio data is set to predetermined timing (such as a start time point and an intermediate time point) in a slow reproduction period obtained by stretching the high frame rate period. Then, the recording format conversion unit 150 supplies data including the packets after the format conversion as a stream to the recording unit 180 via a signal line 159, and the recording unit 180 records the stream.

Meanwhile, although circuits of the moving image capturing unit 130, the moving image processing unit 140, the audio capturing unit 160, the audio processing unit 170 and the like are provided on one device, they may also be provided separately on a plurality of devices. For example, it is also possible to provide only the circuit for the image recording (such as the moving image capturing unit 130 and the moving image processing unit 140) on the imaging device 100 and to provide the circuit for the audio recording (such as the audio capturing unit 160 and the audio processing unit 170) on the audio recording device.

[Configuration Example of Moving Image Capturing Unit]

Figure 2:
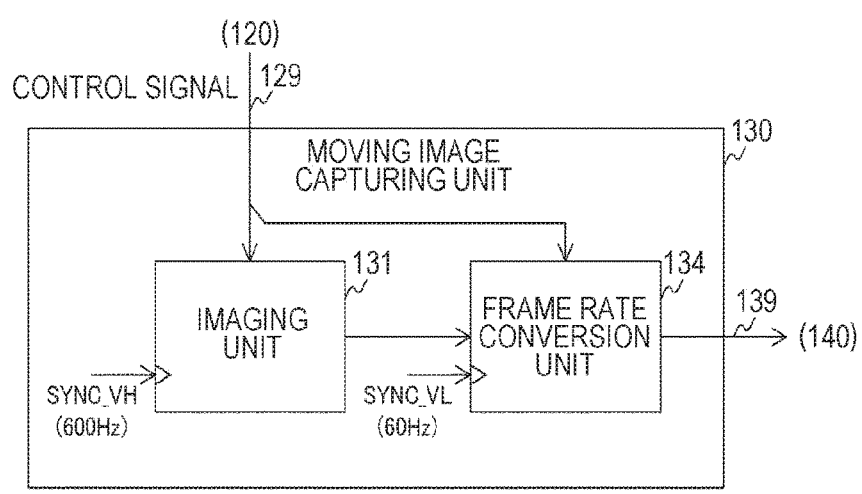
FIG. 2 is a block diagram illustrating a configuration example of a moving image capturing unit in the first embodiment.

FIG. 2 is a block diagram illustrating a configuration example of the moving image capturing unit 130 in the first embodiment. The moving image capturing unit 130 is provided with an imaging unit 131 and a frame rate conversion unit 134.

The imaging unit 131 images a plurality of video frames in chronological order in synchronization with a predetermined vertical synchronization signal SYNC_VH according to the operation signal. The imaging unit 131 is provided with, for example, an optical system such as an imaging lens and an imaging element. A complementary metal oxide semiconductor (CMOS) sensor and a charge coupled device (CCD) sensor are used, for example, as the imaging element. Also, a frequency of the vertical synchronization signal SYNC_VH is higher than the frame rate at the time of reproduction, and is, for example, 600 hertz (Hz). The imaging unit 131 images over a period from the start timing to the end timing of the image recording indicated by the control signal and supplies each of the video frames to the frame rate conversion unit 134.

The frame rate conversion unit 134 converts the frame rate according to the control signal. The frame rate conversion unit 134 converts the frame rate of the video frame imaged in the high frame rate period indicated by the control signal to the frame rate of a frequency of a vertical synchronization signal SYNC_VL (for example, 60 hertz: Hz). The frame rate is converted, for example, by processing of dropping a video frame from every constant number thereof. On the other hand, the frame rate of the video frame imaged outside the high frame rate period is not converted. The frame rate conversion unit 134 supplies the moving image data including these video frames to the moving image processing unit 140.

[Configuration Example of Audio Capturing Unit]

Figure 3:
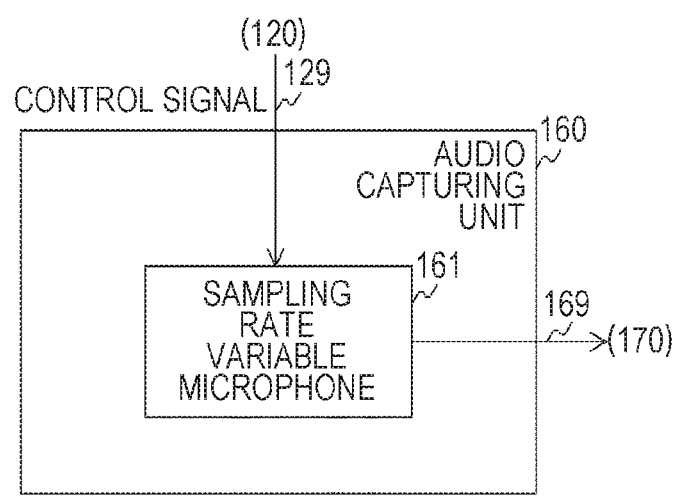
FIG. 3 is a block diagram illustrating a configuration example of an audio capturing unit in the first embodiment.

FIG. 3 is a block diagram illustrating a configuration example of the audio capturing unit 160 in the first embodiment. The audio capturing unit 160 is provided with a sampling rate variable microphone 161.

The sampling rate variable microphone 161 samples the audio while changing the sampling rate according to the control signal. The sampling rate variable microphone 161 samples the audio at a constant sampling rate (for example, 48 kilohertz) outside the high frame rate period indicated by the control signal. On the other hand, in the high frame rate period, the sampling rate variable microphone 161 switches the sampling rate to a value higher than that outside the high frame rate period (for example, 96 kilohertz) to sample the audio. The sampling rate variable microphone 161 supplies the normal audio data sampled outside the high frame rate period and the high-resolution audio data sampled in the high frame rate period to the audio processing unit 170.

Meanwhile, although a digital microphone which outputs the digital audio data is provided as the sampling rate variable microphone 161, an analog microphone which outputs an analog sound signal may also be provided in place of the digital microphone. In this case, an AD converter which performs AD conversion of the sound signal from the analog microphone is further provided, and the AD converter switches the sampling rate to sample.

Also, the audio capturing unit 160 may gradually switch in stages when switching a sampling frequency (sampling rate). For example, the audio capturing a 160 increases the sampling rate little by little over a constant time period from the start time point of the high frame rate period. Also, the audio capturing unit 160 decreases the sampling rate little by little over a period from a time point a predetermined time period before an end time point of the high frame rate period to the end time point. This makes it possible to reduce a sense of discomfort in a portion where the sampling rate switches.

[Configuration Example of Audio Processing Unit]

Figure 4:
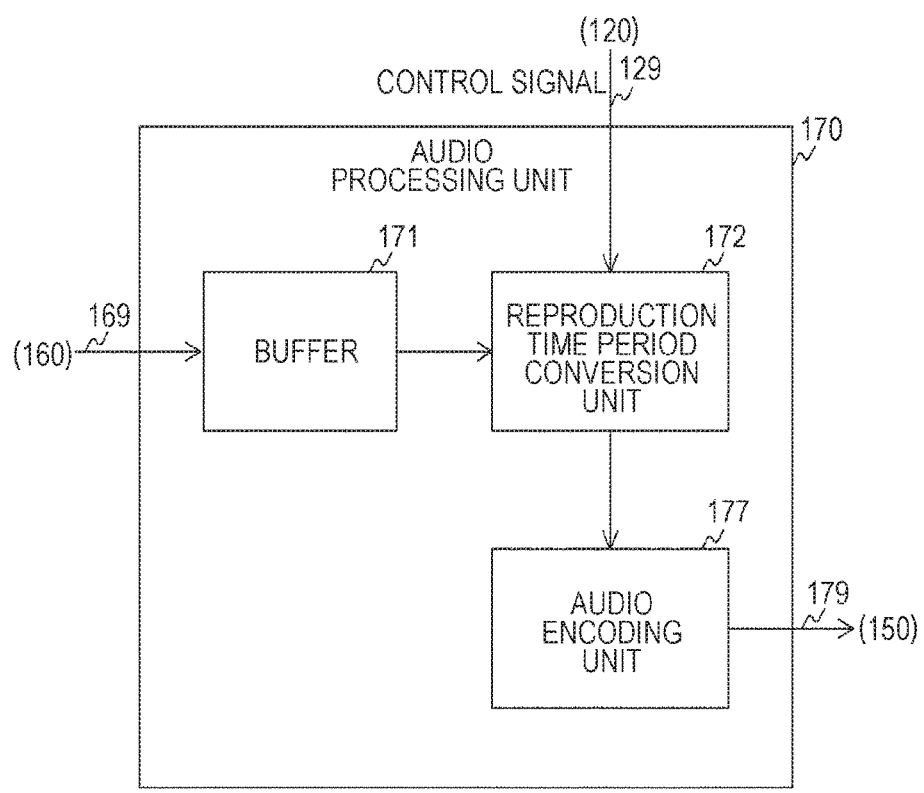
FIG. 4 is a block diagram illustrating a configuration example of an audio processing unit in the first embodiment.

FIG. 4 is a block diagram illustrating a configuration example of the audio processing unit 170 in the first embodiment. The audio processing unit 170 is provided with a buffer 171, a reproduction time period conversion unit 172, and an audio encoding unit 177.

The buffer 171 holds the audio data of a constant data amount. The reproduction time period conversion unit 172 converts the reproduction time period of the high-resolution audio data. The reproduction time period conversion unit 172 reads out the audio data sampled in the high frame rate period indicated by the control signal (that is, high-resolution audio data) from the buffer 171, stretches the reproduction time period at a constant scale factor, and supplies the same to the audio encoding unit 177. On the other hand, the audio data sampled outside the high frame rate period is supplied as-is to the audio encoding unit 177 without the reproduction time period changed.

The audio encoding unit 177 encodes the audio data to the audio frames. The audio encoding unit 177 packetizes the audio frame into the audio packet and supplies the same to the recording format conversion unit 150 via the signal line 179.

Figures 5A, 5B, 5C, 5D, 5E:
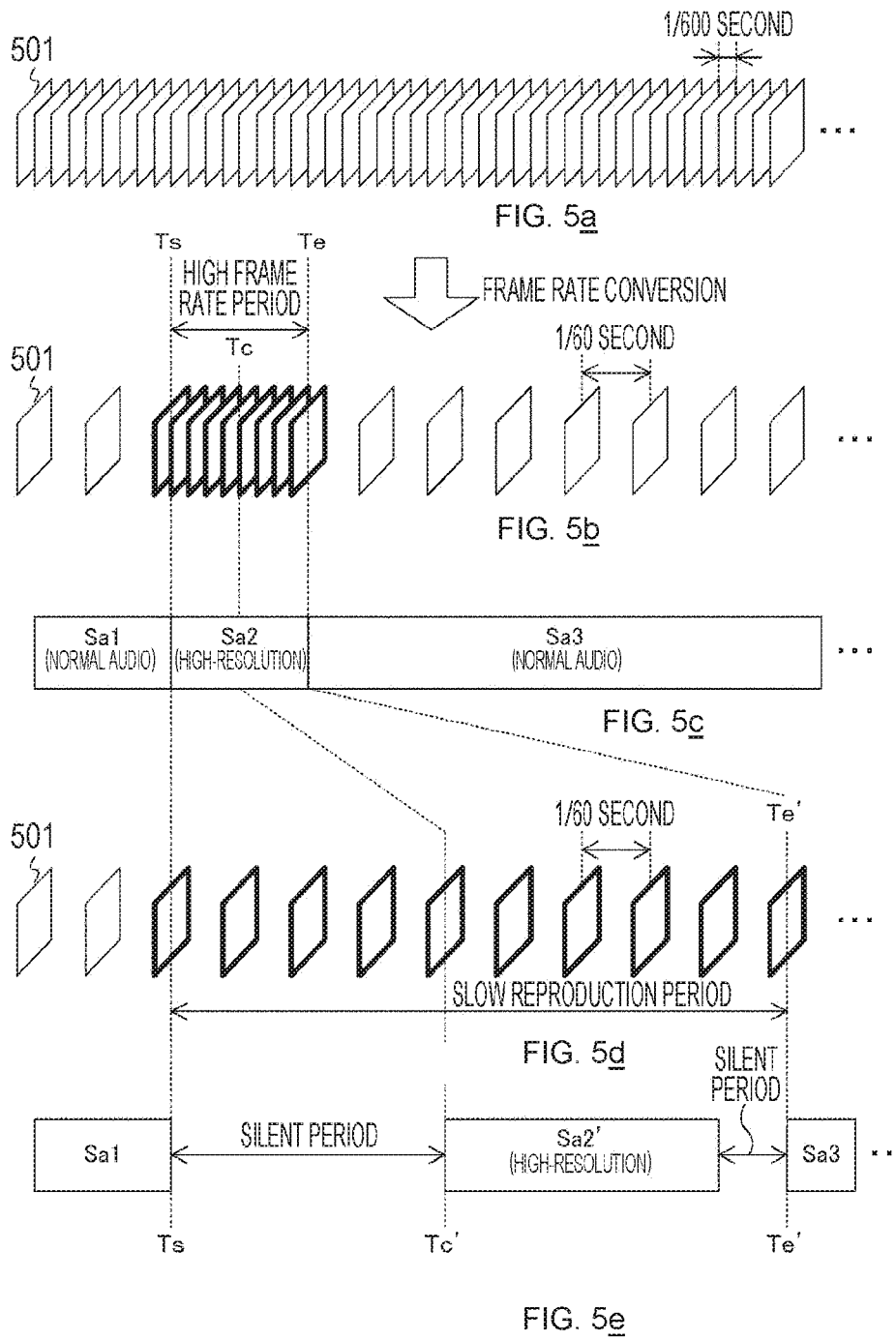
FIGS. 5a, 5b, 5c, 5d, and 5e are views illustrating an example of a stream of the first embodiment.

FIGS. 5a, 5b, 5c, 5d, and 5e are views illustrating an example of the stream in the first embodiment. FIG. 5a is a view illustrating an example of the video frame imaged in synchronization with the vertical synchronization signal SYNC _VH. In a case where the frequency of the vertical synchronization signal $SYNC_{13}$ VH is 600 hertz (Hz), a plurality of video frames is imaged every 1/600 second.

FIG. 5b is a view illustrating an example of the frame after the frame rate conversion. The high frame rate period is set according to the operation of the user, and outside the high frame rate period, the frame rate is converted to a low frame rate of, for example, 60 hertz (Hz). The video frame enclosed by a bold line in this drawing is the video frame in the high frame rate period.

FIG. 5c is a view illustrating an example of the sampled audio data. For example, audio data Sa1, Sa2, and Sa3 are sequentially generated by the sampling. Herein, the audio data Sa1 is the normal audio data sampled at a relatively low sampling rate (for example, 48 kilohertz) before start timing Ts of the high frame rate period. Also, the audio data Sa2 is the high-resolution audio data sampled at a relatively high sampling rate (for example, 96 kilohertz) over the high frame rate period. Also, the audio data Sa3 is the normal audio data sampled at a relatively low sampling rate after end timing Te of the high frame rate period.

FIG. 5d illustrates an example of the video frame the reproduction time point of which is set. For each of the video frames including a detection frame, the reproduction time point for reproducing at a low frame rate of 60 hertz (Hz), for example, is set. According to this reproduction time point, a moving body imaged in the high frame rate period is reproduced in a very slow motion. For example, in a case where the frame rate in the high frame rate period is 600 hertz (Hz) and the frame rate at the time of reproduction is 60 hertz (Hz), the slow reproduction period is stretched to 10 times the high frame rate period, and an operating speed of the moving body drops to one-tenth.

FIG. 5e is a view illustrating an example of the audio data after the reproduction time period conversion. The audio processing unit 170 stretches the reproduction time period of the high-resolution audio data (Sa2) to generate audio data Sa2'. The reproduction time point of the audio data Sa2' is set, for example, at an intermediate time point Tc' of the slow reproduction period. Meanwhile, the reproduction time point of the converted audio data Sa2' is not limited to the intermediate time point Tc' of the slow reproduction period and may be the start timing Ts of the slow reproduction period, for example. Also, in a case where there is a continuous silent period immediately before the start timing Ts of the slow reproduction period, the imaging device 100 may also make start timing of the period the reproduction time point of the audio data Sa2'.

Figure 6A:
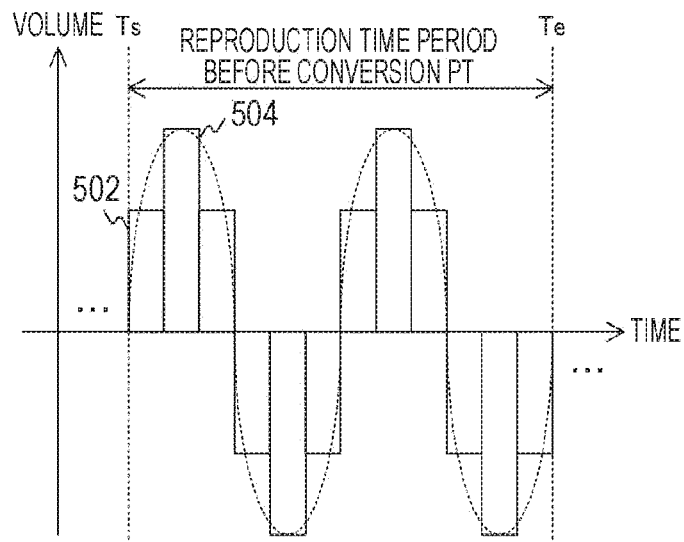
FIGS. 6a and 6b are views illustrating an example of high-resolution audio data before and after conversion of a reproduction time period in the first embodiment.
Figure 6B:
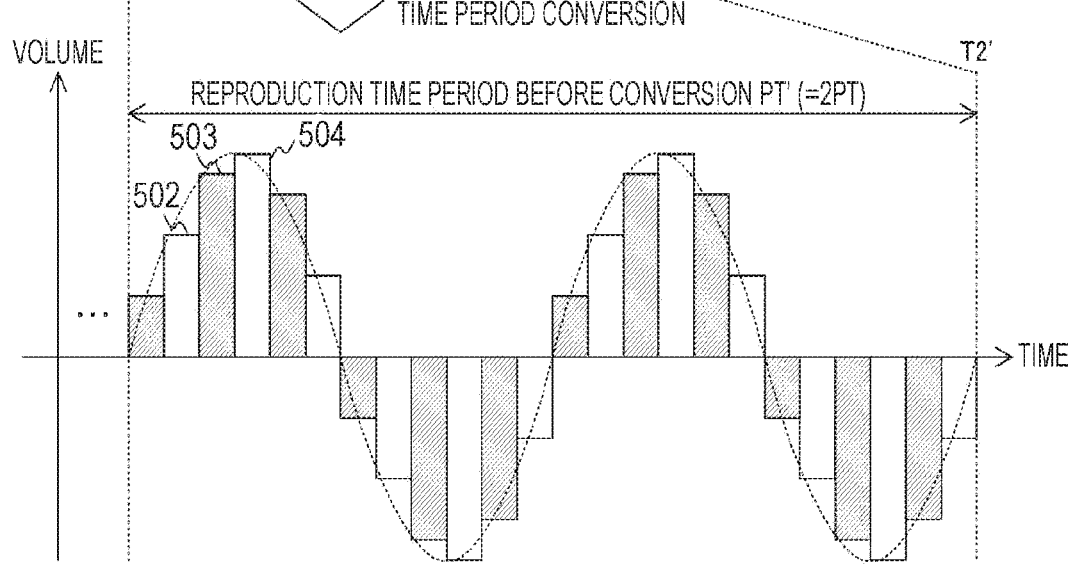

FIGS. 6a and 6b are views illustrating an example of the high-resolution audio data before and after converting reproduction time period in the first embodiment. FIG. 6a is a view illustrating an example of the high-resolution audio data before converting the reproduction time period, and FIG. 6b is a view illustrating an example of the high-resolution audio data after converting the reproduction time period. Also, in this drawing, the volume level is plotted along the ordinate and the time is plotted along the abscissa. Also, a dotted line indicates a waveform of the analog sound signal restored when the audio data is subjected to digital to analog (DA) conversion.

As exemplified in FIG. 6a, the audio data such as audio data 502 and 504 are sampled at a relatively high sampling rate in the high frame rate period. For example, in a case where the sampling rate is 96 kilohertz (kHz), 96×1000 audio data are generated per second. Assuming that a quantization bit length is 24 bits, an amount of data per second of monaural audio data is 96×1000×24 bits. Meanwhile, the quantization bit length is not limited to 24 bits and may be 16 bits and the like.

Then, as illustrated in FIG. 6b, data such as audio data 503 is interpolated between the audio data (502 and 504) before conversion. In the drawing, hatched portions indicate interpolated audio data. The audio processing unit 170 interpolates, for example, data indicating an intermediate volume level between the volume levels of the adjacent audio data 502 and 504 as the audio data 503. By this interpolation, the reproduction time period of the audio data is stretched. For example, in a case where the number of audio data is doubled by the interpolation, the reproduction time period is doubled. Processing of stretching the reproduction time period in this manner is referred to as time stretching or speech speed conversion.

Herein, a maximum frequency of analog audio which may be restored by the sampled audio data has a value half a sampling frequency fs from the sampling theorem. The value half the sampling frequency (fs/2) is referred to as the Nyquist frequency. The Nyquist frequency (restorable frequency) decreases due to the stretching of the reproduction time period. For example, in a case where the reproduction time period is doubled, the Nyquist frequency decreases by half.

Meanwhile, although the audio processing unit 170 performs the time stretching by processing of stretching the waveform as-is, a method is not limited to this as long as the reproduction time period may be stretched. For example, the audio processing unit 170 may stretch the reproduction time period by processing of dividing the audio waveform into a plurality of pieces and duplicating a part of them to insert. According to this processing, it is possible to stretch the reproduction time period with almost no change in frequency. In this case also, slight deterioration in audio quality occurs in a portion in which the reproduction time period is converted, so that it is possible to inhibit the deterioration in audio quality by recording the high-resolution audio data.

Figure 7:
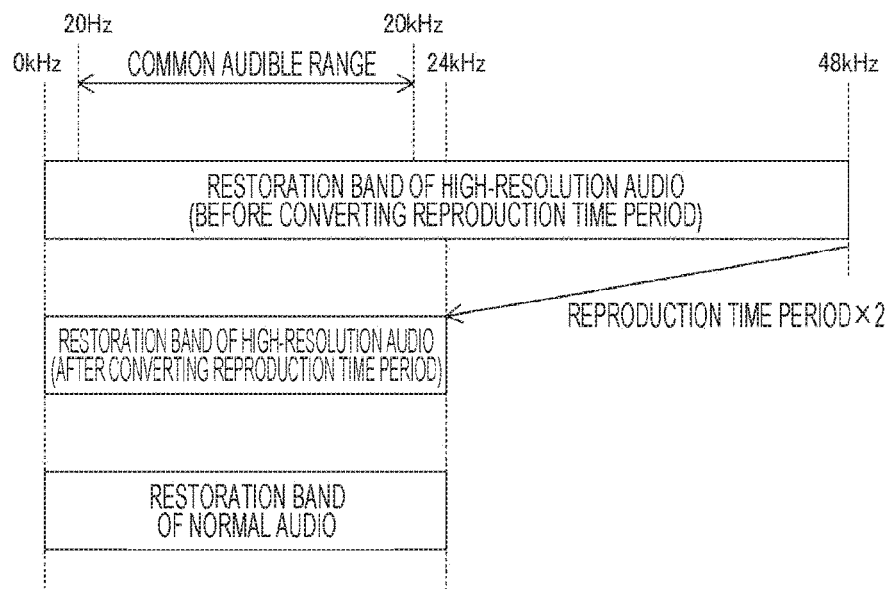
FIG. 7 is a view illustrating an example of a restoration band of audio data in the first embodiment.

FIG. 7 is a view illustrating an example of a restoration band of the audio data in the first embodiment. Herein, the sampling rate of the high-resolution audio data is 96 kilohertz (kHz), and the sampling rate of the normal audio data is 48 kilohertz (kHz). As illustrated in the drawing, before converting the reproduction time, a frequency band (hereinafter referred to as "restoration band") of the audio restored by the DA conversion of the high-resolution audio data is 0 to 48 kilohertz (kHz) from the sampling theorem. If the reproduction time period of this high-resolution audio data is doubled, the restoration band is half of that before the stretching, that is, 0 to 24 kilohertz (kHz). On the other hand, the restoration band of the normal audio data is 0 to 24 kilohertz (kHz) from the sampling theorem.

Herein, a common audible range of human beings is 20 hertz (Hz) to 20 kilohertz (kHz) which is narrower than the restoration band after the reproduction time period is changed. Therefore, even if the reproduction time period is changed, the user does not feel the deterioration in audio quality. Also, since the restoration band of the high-resolution audio data after the reproduction time is changed is the same as that of the normal audio data, the audio quality of the slow reproduction period in which the reproduction time period is stretched is not different from that in the period in which this is not stretched.

On the other hand, the device disclosed in Patent Document 1 records audio without changing the sampling rate even in the high frame rate period. In this configuration, if the reproduction time period of the normal audio data sampled in the high frame rate period is stretched, the restoration band becomes narrower as compared to that of the period in which this is not stretched and the audio quality is deteriorated.

Meanwhile, on the basis of the above-described sampling theorem, it is desirable that the sampling rate of the normal audio data is higher than twice the maximum frequency of the audible range (approximately 20 kilohertz). Also, it is desirable that the sampling rate of the high-resolution audio data is higher than a value obtained by multiplying twice the maximum frequency of the audible range by a scale factor (such as two) for the reproduction time period.

Figure 8A:
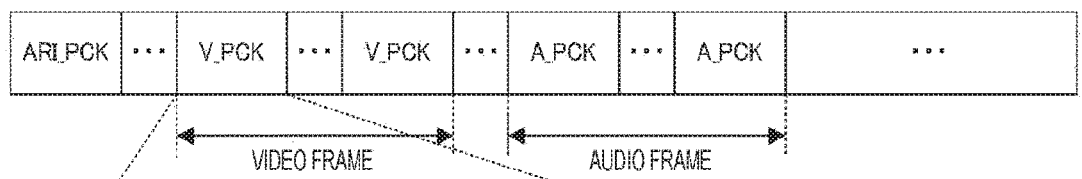
FIGS. 8a and 8b are views illustrating an example of a data structure of a stream and a packet in the first embodiment.
Figure 8B:
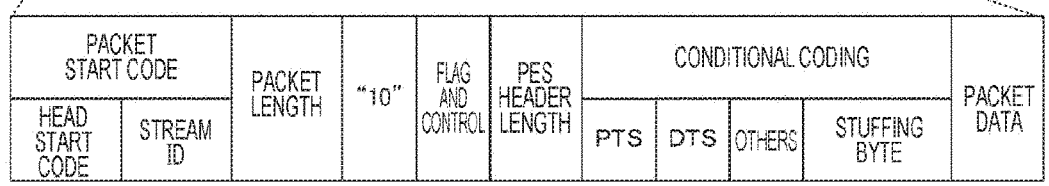

FIGS. 8a and 8b are views illustrating an example of a data structure of the stream and the packet in the first embodiment. FIG. 8a is a view illustrating an example of the data structure of the stream. In the MPEG-2TS standards, the stream includes, for example, a packet ARI_PCK including auxiliary data, a video packet V_PCK, and an audio packet A_PCK. The video frame is stored in one or more video packets V_PCK, and the audio frame is stored in one or more audio packets A_PCK.

FIG. 8b is a view illustrating an example of a data structure of the video packet V_PCK. In the MPEG-2TS standards, a packet start code, a packet length, a code of "10", flag and control, a PES header length, conditional coding, and packet data are stored in the video packet V_PCK. Meanwhile, a data structure of the audio packet is similar to that of the video packet.

In a field of the packet start code, a head start code indicating a head of the packet and a stream ID for identifying the stream are stored. In a field of the conditional coding, the PTS indicating the reproduction time point and a decoding time stamp (DTS) indicating a decoding time are stored.

[Operation Example of Imaging Device]

FIG. 9 is a flowchart illustrating an example of image recording processing in the first embodiment. The image recording processing starts, for example, when operation of starting the image recording (such as pressing of an image recording button) is performed. The imaging device 100 generates the video frame at a high frame rate of 600 hertz (Hz) (step S901). Also, the imaging device 100 sets the high frame rate period when a scene change is detected (step S902), and converts the frame rate to a low frame rate of 60 hertz (Hz) outside the high frame rate period (step S903).

Then, the imaging device 100 encodes the video frame (step S904). The imaging device 100 determines whether operation for ending the image recording (such as pressing of a stop button) is performed (step S905). In a case where the operation for ending the image recording is not performed (step S905: No), the imaging device 100 repeats step S901 and subsequent steps. On the other hand, in a case where the operation for ending the image recording is performed (step S905: Yes), the imaging device 100 ends the image recording processing.

Figure 10:
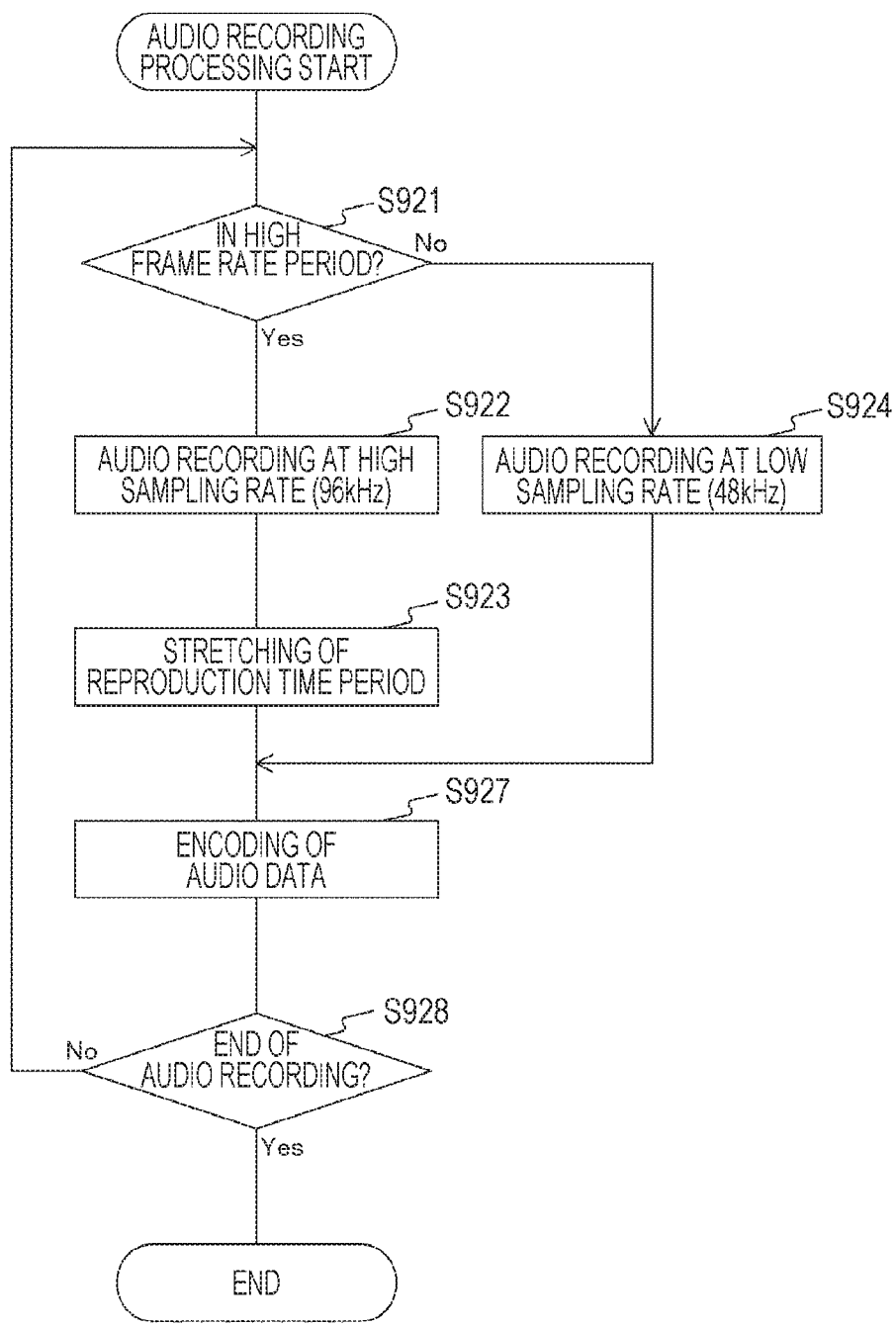
FIG. 10 is a flowchart illustrating an example of audio recording processing in the first embodiment.

FIG. 10 is a flowchart illustrating an example of audio recording processing in the first embodiment. The audio recording processing starts, for example, when the operation for starting the audio recording (such as the pressing of the image recording button) is performed.

The imaging device 100 determines whether current time is in the high frame rate period (step S921). In a case where this is in the high frame rate period (step S921: Yes), the imaging device 100 performs the audio recording at a high sampling rate of 96 kilohertz (kHz) (step S922), and stretches the reproduction time period of the generated high-resolution audio data (step S923). On the other hand, in a case where this is not in the high frame rate period (step S921: No), the imaging device 100 performs the audio recording at a low sampling rate of 48 kilohertz (kHz) (step S924).

After step S923 or S924, the imaging device 100 encodes the audio data to generate the audio frame (step S927), and determines whether operation for ending the audio recording (such as pressing of a stop button) is performed (step S928). In a case where the operation for ending the audio recording is not performed (step S928: No), the imaging device 100 repeats step S921 and subsequent steps. On the other hand, in a case where the operation for ending the audio recording is performed (step S928: Yes), the imaging device 100 ends the audio recording processing.

In this manner, according to the first embodiment of the present technology, the sampling at a relatively high sampling rate is performed to generate the high-resolution audio data in the high frame rate period, and the reproduction time period of the data is stretched, so that it is possible to inhibit the deterioration in audio quality due to the stretching of the reproduction time period.

[First Variation]

Although the high frame rate period is manually set in the first embodiment, if this is manually set, the start timing of this period might deviate due to an operation error. Also, if the high frame rate period is manually set, the operation of the imaging device 100 becomes complicated, and convenience of the imaging device 100 might be deteriorated. An imaging device 100 according to a first variation of the first embodiment is different from that of the first embodiment in that a high frame rate period is set without depending on operation of a user.

Figure 11:
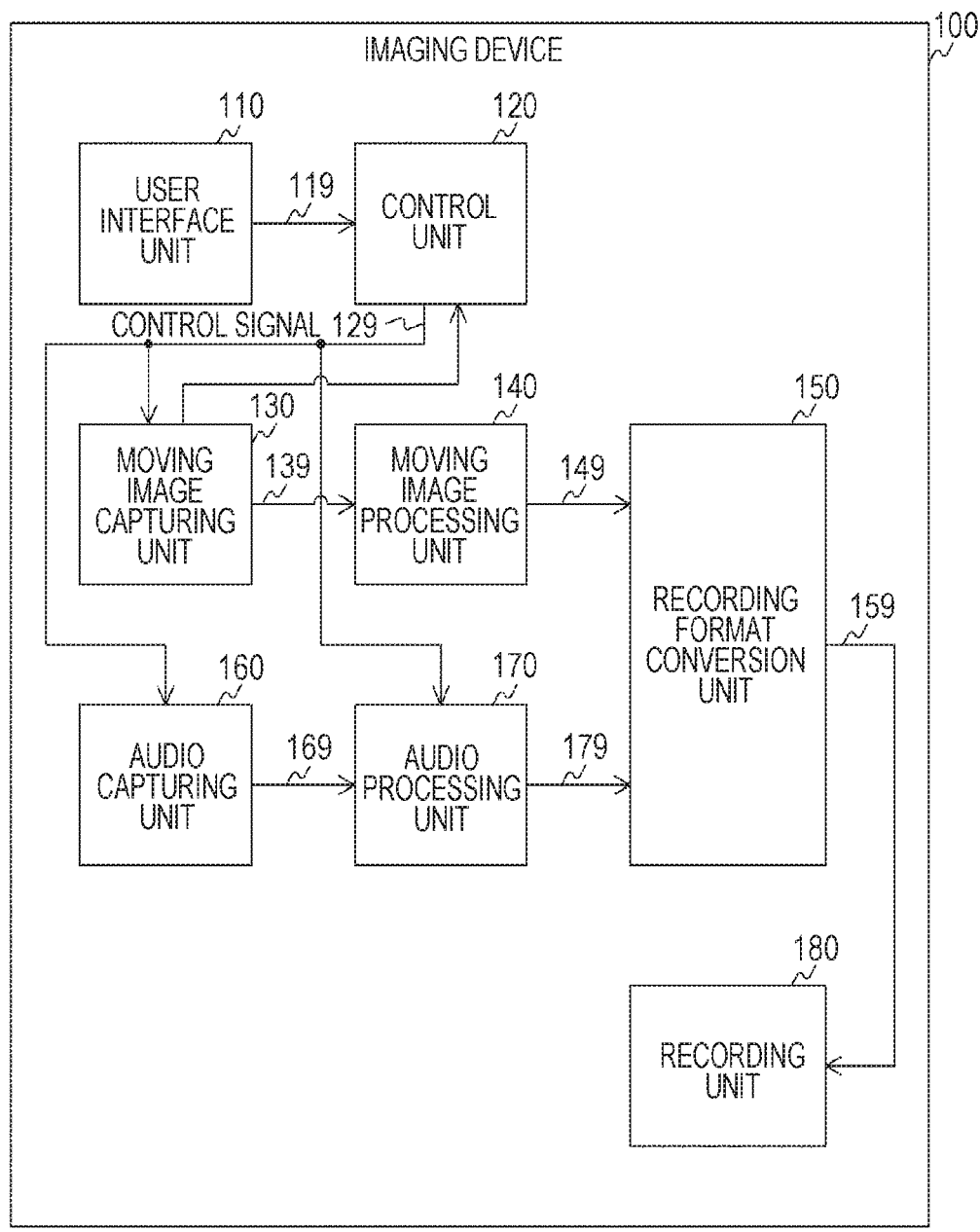
FIG. 11 is a block diagram illustrating a configuration example of an imaging device in a first variation of the first embodiment.

FIG. 11 is a block diagram illustrating a configuration example of the imaging device 100 in the first variation of the first embodiment. A moving image capturing unit 130 of the first variation is different from that of the first embodiment in that timing at which a scene changes is detected as scene change timing. The moving image capturing unit 130 supplies the detected scene change timing to a control unit 120.

The control unit 120 of the first variation is different from that of the first embodiment in that a constant period including the detected scene change timing is set as the high frame rate period. For example, a period of a constant length (such as one second) around the scene change timing is set as the high frame rate period.

Meanwhile, although the control unit 120 is configured to set only start timing and end timing of audio recording according to the operation of the user, this may further set the high frame rate period according to the operation of the user. For example, the control unit 120 may set a period including either the scene change timing or timing specified by the user as the high frame rate period.

Figure 12:
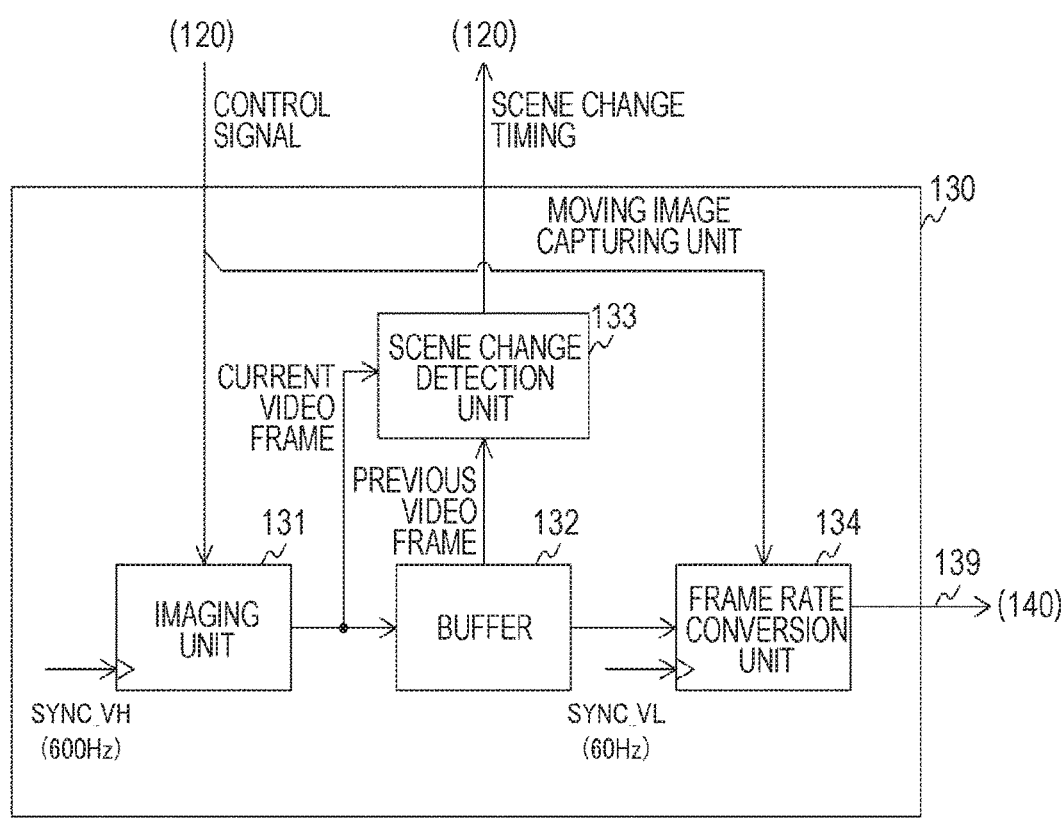
FIG. 12 is a block diagram illustrating a configuration example of a moving image capturing unit in the first variation of the first embodiment.

FIG. 12 is a block diagram illustrating a configuration example of the moving image capturing unit 130 in the first variation of the first embodiment. The moving image capturing unit 130 of the first variation is different from that of the first embodiment in further including a buffer 132 and a scene change detection unit 133.

The buffer 132 holds a video frame imaged by an imaging unit 131.

The scene change detection unit 133 detects the video frame when the scene changes. The scene change detection unit 133 obtains the video frame from the imaging unit 131 as a current video frame and obtains the video frame before the current video frame as a previous video frame from the buffer 132. Then, the scene change detection unit 133 compares the current video frame with the previous video frame, and detects whether the scene changes on the basis of a comparison result. When the scene change occurs, the scene change detection unit 133 supplies imaging time of the frame at that time to the control unit 120 as the scene change timing.

In this manner, according to the first variation of the first embodiment of the present technology, since the imaging device 100 detects the scene change timing and sets the constant period including the timing as the high frame rate period, it is not necessary to manually set the high frame rate period.

[Second Variation]

Although the period in which high-resolution audio data is recorded is manually set in the first embodiment, if this is manually set, an operation error might occur and convenience of the imaging device 100 might be deteriorated. Also, although both the audio recording and image recording are performed in the first embodiment, as an image recording time period becomes longer, a data amount of the moving image data increases, and a storage capacity of the recording unit 180 might be insufficient. A device of a second variation of the first embodiment is different from that of the first embodiment in that a high frame rate period is set without depending on operation of a user and that image recording is not performed.

Figure 13:
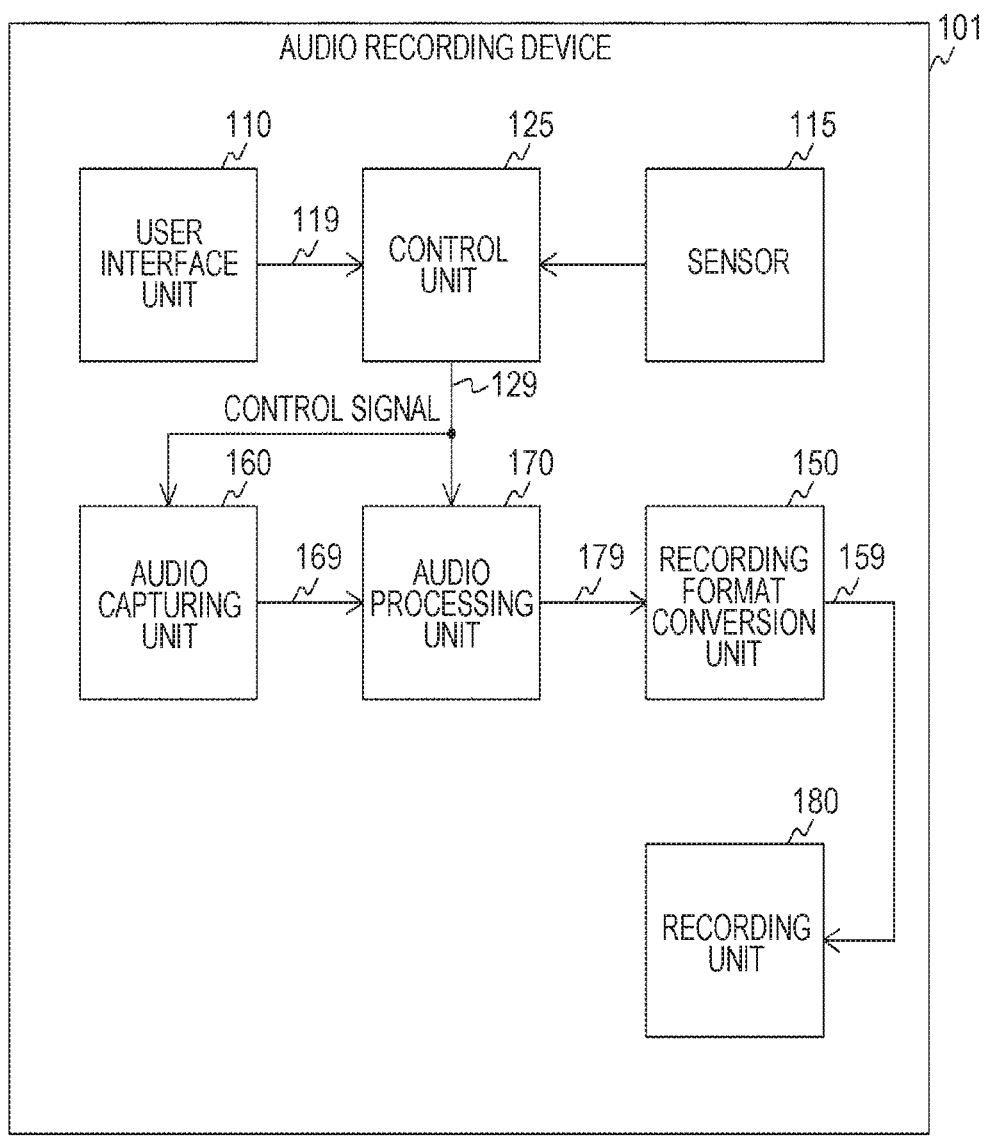
FIG. 13 is a block diagram illustrating a configuration example of an audio recording device in a second variation of the first embodiment.

FIG. 13 is a block diagram illustrating a configuration example of an audio recording device 101 in the second variation of the first embodiment. The audio recording device 101 is provided with a user interface unit 110, a sensor 115, a control unit 125, an audio capturing unit 160, an audio processing unit 170, a recording format conversion unit 150, and a recording unit 180.

The sensor 115 detects a detection target such as a suspicious individual. For example, a piezoelectric sensor which converts force applied to a piezoelectric body into an electric signal and an infrared sensor which converts a light amount of infrared ray into an electric signal are used as the sensor 115. The sensor 115 supplies a detection signal indicating whether the detection target is detected to the control unit 125.

The control unit 125 allows the audio capturing unit 160 to start audio recording according to an operation signal, and to end the audio recording according to the operation signal. Also, when the detection target is detected by the sensor during the audio recording, the control unit 125 sets a constant period including detection timing of the detection target as a high-resolution audio recording period, and allows the audio capturing unit 160 to sample at a relatively high sampling rate in this period.

The audio capturing unit 160 of the second variation is similar to that of the first embodiment except for generating high-resolution audio data in a high-resolution audio recording period in place of a high frame rate period. Also, the audio processing unit 170 of the second variation is similar to that of the first embodiment except for converting a reproduction time period of the high-resolution audio data in the high-resolution audio recording period in place of the high frame rate period.

Meanwhile, although the control unit 120 is configured to set only start timing and end timing of the audio recording according to the operation of the user, this may further set the high-resolution audio recording period according to the operation of the user. For example, the control unit 120 may set a period including either detection timing of the sensor 115 or timing specified by the user as the high-resolution audio recording period.

Also, a moving image capturing unit 130 may be further provided to detect scene change timing as in the first variation. In this case, the control unit 120 may set, for example, a period including either the detection timing of the sensor 115 or the scene change timing as the high-resolution audio recording period. Furthermore, the control unit 120 may set a period including any one of the detection timing of the sensor 115, the scene change timing, and the timing specified by the user as the high-resolution audio recording period.

In this manner, according to the second variation of the first embodiment of the present technology, since the audio recording device 101 sets the constant period including the detection timing of the detection target as the high-resolution audio recording period, it is unnecessary to manually set the period in which the high-resolution audio data is recorded. Also, since the audio recording device 101 performs only the audio recording without performing the image recording, it is possible to decrease a data amount of the data to be recorded in the recording unit 180.

<2. Second Embodiment>

Although the reproduction time period of the high-resolution audio data is stretched in the first embodiment, if the stretched reproduction time period is shorter than the slow reproduction period, a silent time period might occur and a reproduction quality might be deteriorated. An imaging device 100 according to a second embodiment is different from that of the first embodiment in that a silent time period is shortened.

Figure 14:
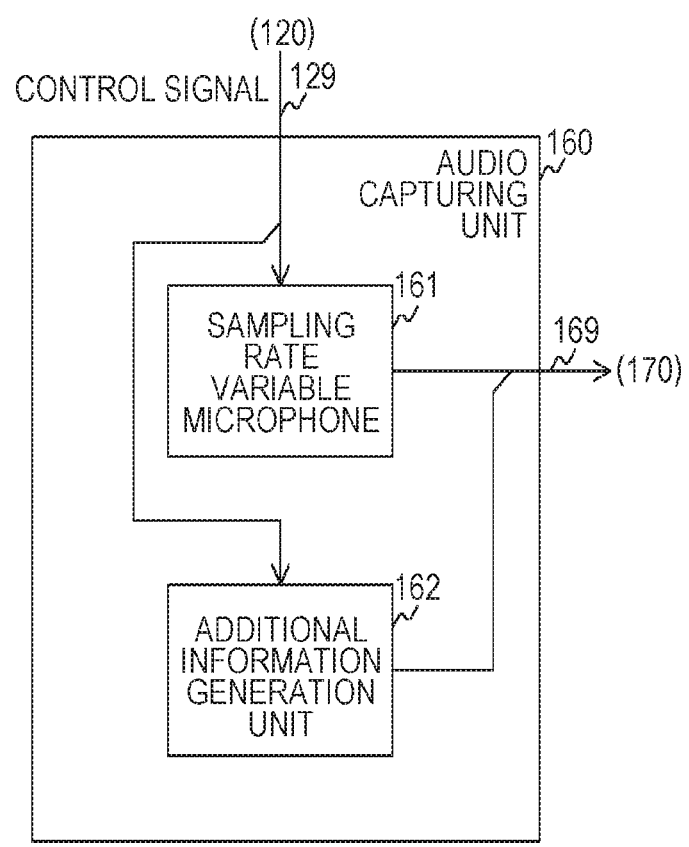
FIG. 14 is a block diagram illustrating a configuration example of an audio capturing unit in a second embodiment.

FIG. 14 is a block diagram illustrating a configuration example of an audio capturing unit 160 in the second embodiment. The audio capturing unit 160 of the second embodiment is different from that of the first embodiment in further including an additional information generation unit 162.

The additional information generation unit 162 generates additional information indicating signal processing which should be executed on high-resolution audio data. For example, the signal processing including duplication processing of the high-resolution audio data, adjustment processing of a volume level, and equalizer processing of changing a frequency characteristic is executed. The additional information generation unit 162 generates the additional information including setting contents of the signal processing. The setting contents include reproduction time point of the high-resolution audio data, the number of times of duplication in the duplication processing of the high-resolution audio data and the like. The number of times of duplication is set, for example, by following expression.

$$\text{Number of times of duplication} = \text{SYNC\_}VH/(\text{SYNC\_}VL \times n) \quad \text{Expression 3}$$

In the above-described expression, n represents a scale factor of stretching a reproduction time period of the high-resolution audio data. Meanwhile, in a case where the number of times of duplication does not become an integer, fractional processing such as fractional rounding is performed.

For example, in a case where SYNC_VH is at 600 hertz (Hz), SYNC_LH is at 60 hertz (Hz), and the scale factor n for the reproduction time period is two, "five" is set as the number of times of duplication. The additional information generation unit 162 adds the generated additional information to the audio data and supplies the same to the audio processing unit 170.

Figure 15:
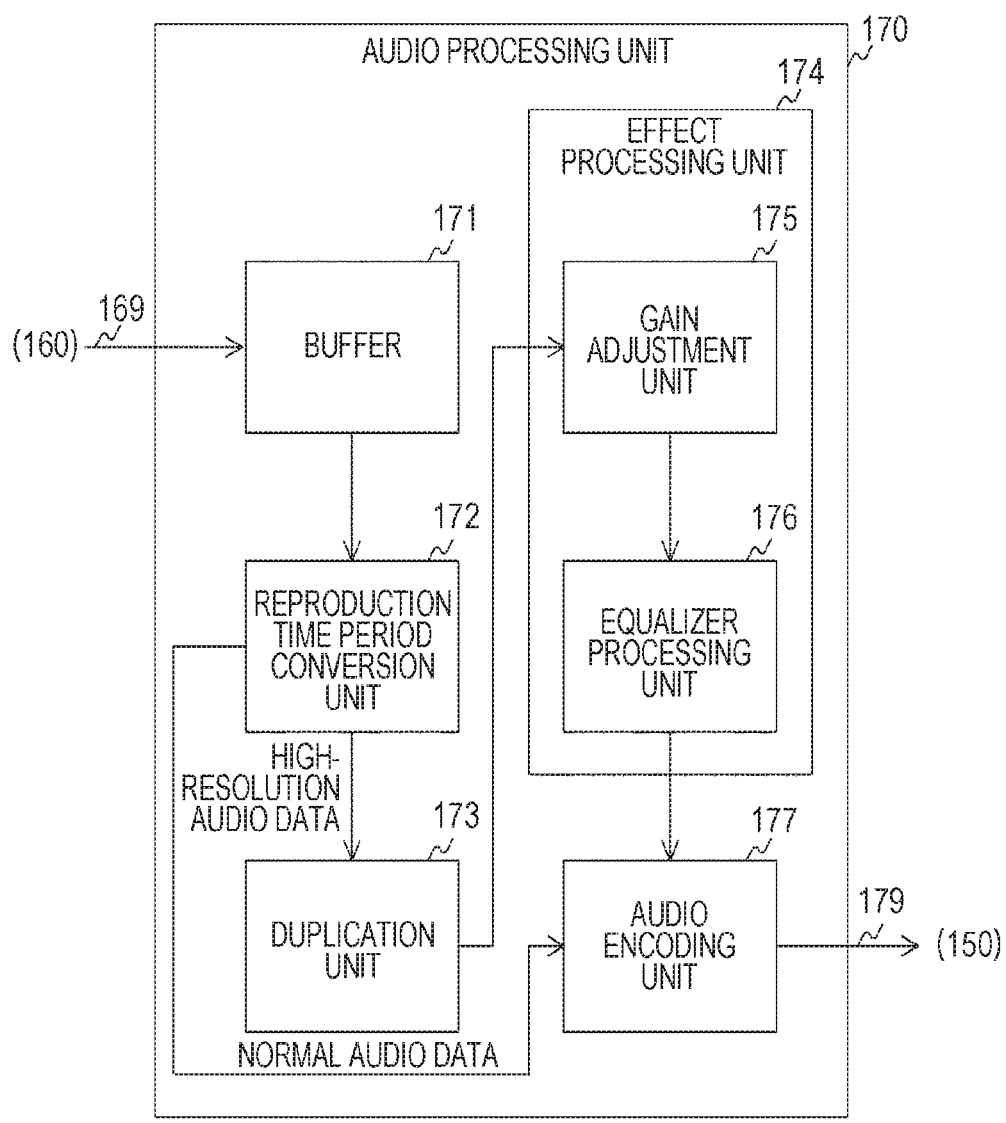
FIG. 15 is a block diagram illustrating a configuration example of an audio processing unit in the second embodiment.

FIG. 15 is a block diagram illustrating a configuration example of an audio processing unit 170 in the second embodiment. The audio processing unit 170 of the second embodiment is different from that of the first embodiment in further including a duplication unit 173 and an effect processing unit 174. The effect processing unit 174 is provided with a gain adjustment unit 175 and an equalizer processing unit 176. Meanwhile, a circuit including the duplication unit 173 and the effect processing unit 174 is an example of a signal processing unit recited in claims.

The duplication unit 173 duplicates the high-resolution audio data. The duplication unit 173 duplicates the number of times of duplication indicated by the additional information and supplies each of the generated duplicated audio data to the gain adjustment unit 175 as duplicated audio data.

The gain adjustment unit 175 adjusts a volume level of the duplicated audio data with a gain. The gain adjustment unit 175 adjusts the volume level with different gains for respective duplicated audio data, for example, according to the additional information. For example, a change amount of the gain for each duplicated audio data is set as the additional information. The gain adjustment unit 175 supplies the equalizer processing unit 176 with the duplicated audio data the volume level of which is adjusted.

The equalizer processing unit 176 performs the equalizer processing of changing frequency characteristics of the duplicated audio data to the characteristics different from each other. For example, the equalizer processing unit 176 performs processing of making the gain for a low-frequency domain lower than a predetermined threshold relatively higher than the gain for a high-frequency domain higher than the threshold for each duplicated audio data, and makes the threshold lower as reproduction time point is later. By such change of the frequency characteristics, it is possible to obtain an acoustic effect in which a degree of emphasis of audio in the low-frequency domain gradually increases with the lapse of time. Herein, an equalizer value is set in the additional information. The equalizer value includes a band in which the gain is controlled, a control amount of the gain and the like. The equalizer processing unit 176 supplies a sound signal after the equalization processing to the audio encoding unit 177.

Meanwhile, a method of changing the frequency characteristic is not limited to the emphasis of the low-frequency domain. The equalizer processing unit 176 may gradually emphasize the high-frequency domain or may change the gain for a constant band around a predetermined center frequency.

Also, although the audio processing unit 170 executes all of the duplication processing, the adjustment processing of the volume level, and the equalizer processing, the configuration is not limited to this, and a configuration in which a part of the processing (such as only the duplication processing) is executed is also possible. Also, in addition to the duplication processing, the adjustment processing of the volume level, the equalizer processing and the like, the audio processing unit 170 may further execute the signal processing other than them (noise removal processing and the like).

Also, although the audio processing unit 170 executes each processing in the order of the change in reproduction time period, the duplication, the adjustment of the volume level, and the equalizer processing, each processing may also be executed in the order different from this order. For example, the audio processing unit 170 may change the reproduction time period after the duplication, or may duplicate after adjusting the volume level.

Figure 16A:
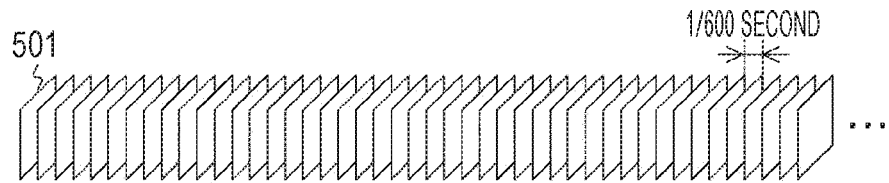
FIGS. 16a, 16b, 16c, 16d, 16e, and 16f are views illustrating an example of a stream in the second embodiment.
Figure 16B:
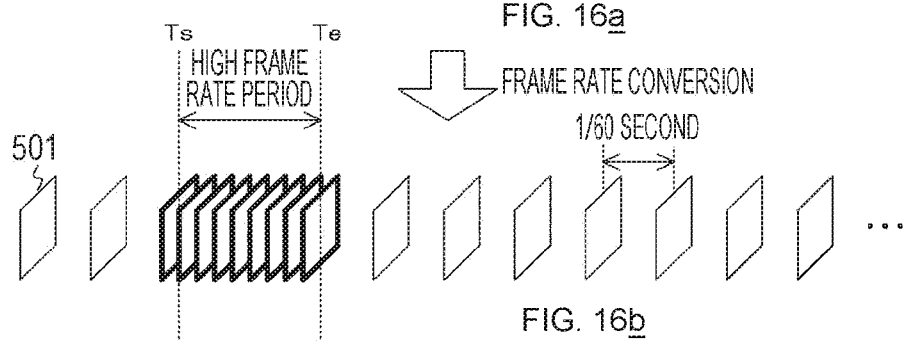
Figure 16C:
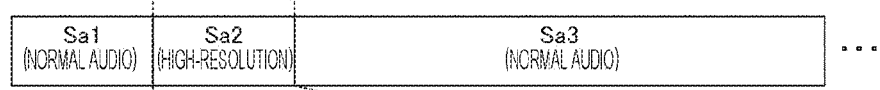
Figure 16D:
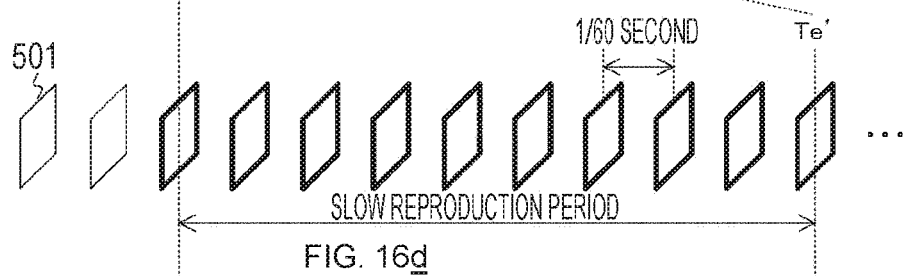

FIGS. 16*a*, 16*b*, 16*c*, 16*d*, and 16*e* are views illustrating an example of a stream in the second embodiment. FIG. 16*a* is a view illustrating an example of a video frame imaged in synchronization with the vertical synchronization signal SYNC$_{13}$VH. FIG. 16*b* is a view illustrating an example of a frame after frame rate conversion. FIG. 16*c* is a view illustrating an example of sampled audio data. FIG. 16*d* illustrates an example of the video frame the reproduction time point of which is set.

Figure 16E:
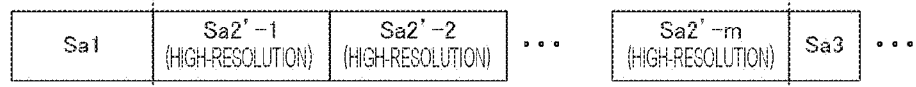

FIG. 16*e* is a view illustrating an example of the duplicated audio data. The audio processing unit 170 stretches the reproduction time period of audio data Sa2 (high-resolution audio data), duplicates the stretched Sa2 to generate m audio data which are duplicated audio data Sa2'-1 to Sa2'-m (m is an integer not smaller than two). The reproduction time point of the first duplicated audio data Sa2'-1 is set, for example, at start timing of a slow reproduction period. Since the duplicated audio data are the same as original audio data before the duplication, the same audio is repeatedly reproduced in the slow reproduction period. This makes it possible to shorten the silent time in the slow reproduction period as compared with a case where this is not repeatedly reproduced.

Figure 16F:
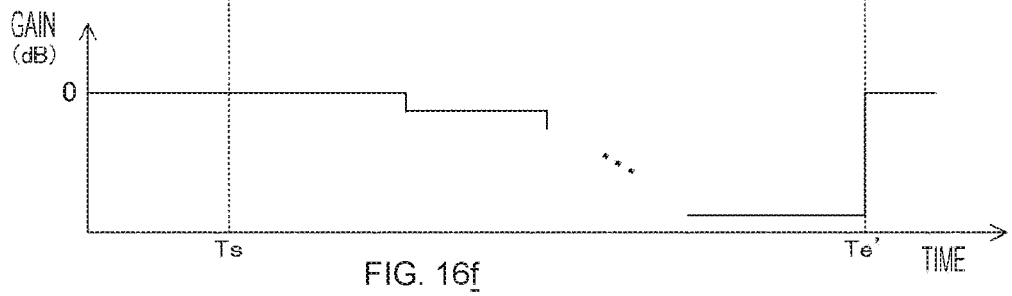

FIG. 16*f* is a view illustrating an example of the gain used for volume adjustment of each of the duplicated audio data. The gain is plotted along the ordinate of FIG. 16*f* and time is plotted along the abscissa. The gain of "0" decibel (dB) is set for the duplicated audio data Sa2'-1 which is reproduced first. For subsequent duplicated audio data Sa2'-2 to Sa2'-m, a smaller gain is set as the reproduction time point is later. As a result, the volume level of the repeatedly reproduced audio gradually decreases.

Figure 17:
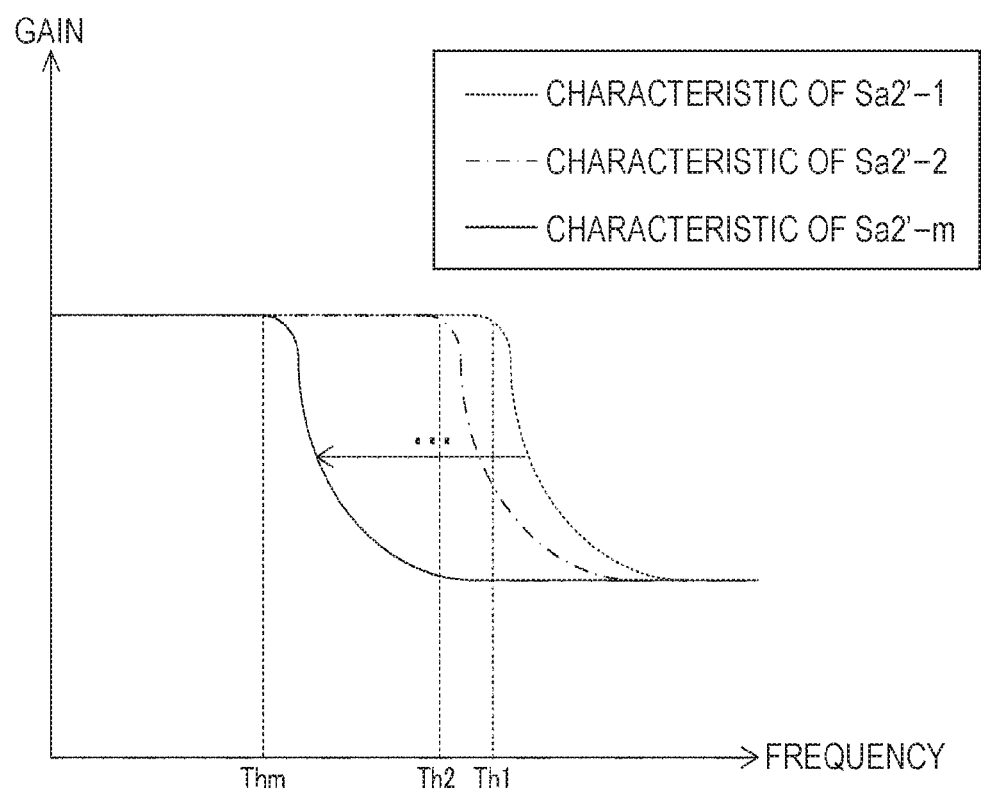
FIG. 17 is a graph illustrating an example of a frequency characteristic in the second embodiment.

FIG. 17 is a graph illustrating an example of the frequency characteristic in the second embodiment. In the drawing, the gain is plotted along the ordinate and a frequency is plotted along the abscissa. Also, a dotted curve indicates the characteristic of the duplicated audio data Sa2'-1 reproduced first in the slow reproduction period, a dashed-dotted curve indicates the characteristic of the duplicated audio data Sa2'-2 reproduced next. A solid curve indicates the characteristic of the duplicated audio data Sa2'-m reproduced the last in the slow reproduction period. In the duplicated audio data Sa2'-1, the gain of a higher-frequency domain than a threshold Th1 is adjusted to be relatively lower, and in the duplicated audio data Sa2'-2, the gain of a higher-frequency domain than a threshold Th2 lower than the threshold Th1 is adjusted to be relatively lower. Also, in the duplicated audio data Sa2'-m, the gain of a higher-frequency domain than a threshold Thm lower than them is adjusted to be relatively lower. By such change of the frequency characteristics, it is possible to obtain an acoustic effect in which a degree of emphasis of audio in the low-frequency domain increases with the lapse of time.

Figure 18:
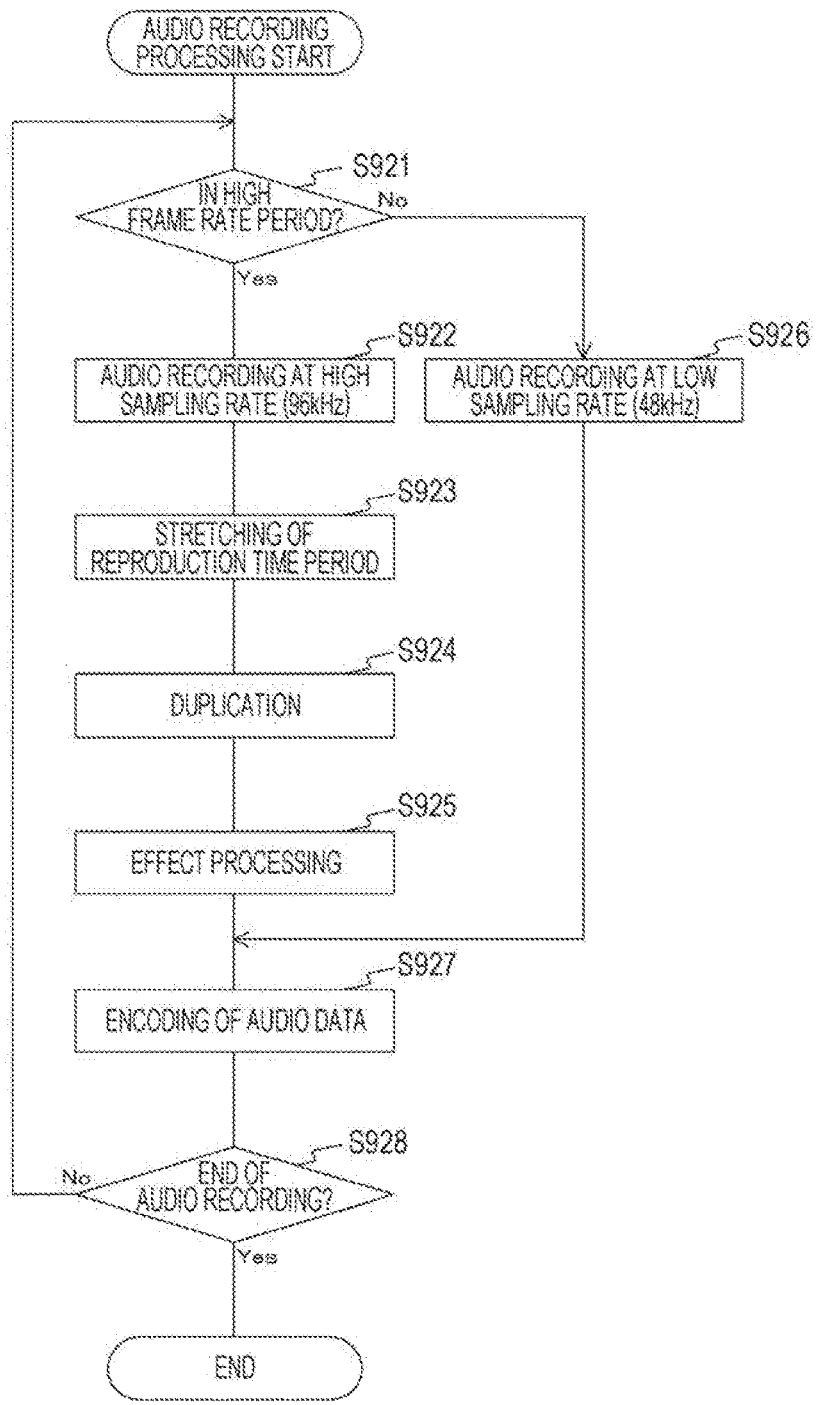
FIG. 18 is a flowchart illustrating an example of audio recording processing in the second embodiment.

FIG. 18 is a flowchart illustrating an example of audio recording processing in the second embodiment. The audio recording processing of the second embodiment is different from that of the first embodiment in that steps S924 and S925 are further executed.

After changing the reproduction time period (step S923), the imaging device 100 duplicates the high-resolution audio data (step S924), and executes effect processing such as the adjustment of the volume level and the equalizer processing (step S925). After step S924 or S925, the imaging device 100 encodes the audio data (step S927).

As described above, according to the second embodiment of the present technology, since the audio processing unit 170 executes the duplication processing on the high-resolution audio data, this may repeatedly reproduce the same audio. Also, since the audio processing unit 170 executes the equalizer processing of changing the frequency characteristics on the high-resolution audio data, this may generate the acoustic effect such as the increase in the degree of emphasis of the audio in the low-frequency domain. By these repetitive reproduction and the acoustic effect, realistic feeling may be improved.

<3. Third Embodiment>

Although the imaging device 100 performs the signal processing such as the duplication of the audio data at the time of recording in the above-described first embodiment, if the duplication and the like is performed at the time of recording, a data size required for recording the stream increases. From a viewpoint of reducing the data size, it is desirable to perform the signal processing such as the duplication at the time of reproduction. An imaging device 100 of a third embodiment is different from that of the first embodiment in performing signal processing of audio data at the time of reproduction.

Figure 19:
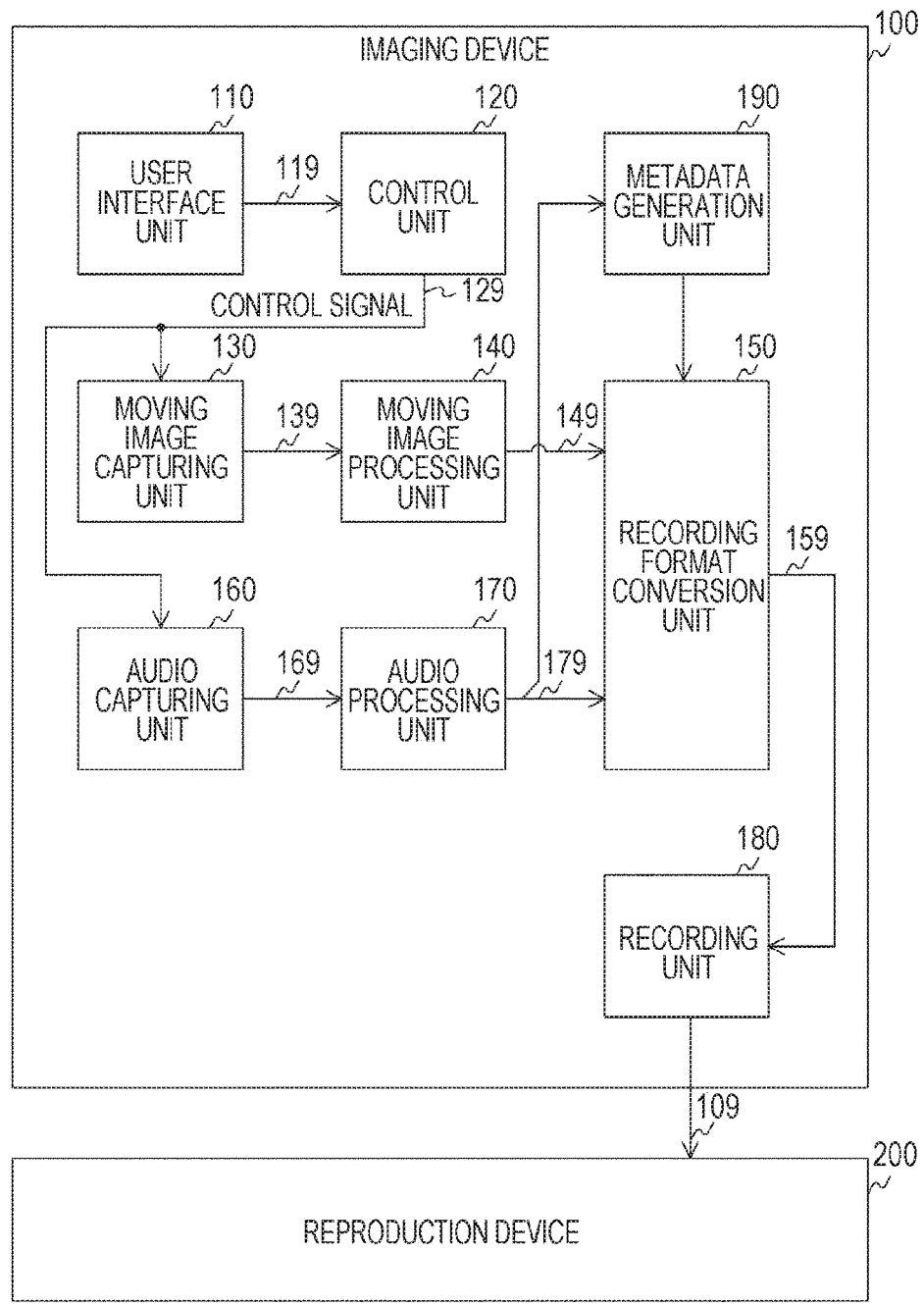
FIG. 19 is a block diagram illustrating a configuration example of an imaging system in a third embodiment.

FIG. 19 is a block diagram illustrating a configuration example of an imaging system in the third embodiment. The imaging system is provided with the imaging device 100 and a reproduction device 200. The imaging device 100 of the third embodiment is different from that of the first embodiment in further including a metadata generation unit 190.

The metadata generation unit 190 generates detailed setting data indicating reproduction time point and contents of the signal processing (the number of times of duplication and the like) of high-resolution audio data from additional information, stores the same in metadata, and supplies the metadata to a recording format conversion unit 150. The recording format conversion unit 150 of the third embodiment adds the metadata to a stream and supplies the same to the reproduction device 200. The reproduction device 200 is a device which reproduces the stream.

FIG. 20 is a block diagram illustrating a configuration example of the reproduction device 200 of the third embodiment. The reproduction device 200 is provided with a user interface unit 210, a metadata separation unit 220, a reproduction control unit 230, a decoding unit 240, a duplication unit 250, an effect processing unit 260, a display unit 270, and a speaker 280.

The user interface unit 210 generates an operation signal according to operation of a user. The operation signal includes, for example, a signal instructing start and stop of reproduction of the stream. The user interface unit 210 supplies the operation signal to the metadata separation unit 220.

The metadata separation unit 220 obtains the stream according to the operation signal and separates the stream into the metadata and encoded data (video packet and audio packet). The metadata separation unit 220 supplies the separated metadata to the reproduction control unit 230 and supplies the encoded data to the decoding unit 240.

The decoding unit 240 decodes the encoded data to original audio data and moving image data. The decoding unit 240 supplies the audio data obtained by decoding to the duplication unit 250 and supplies the moving image data to the display unit 270. The display unit 270 displays the moving image data.

The reproduction control unit 230 controls the duplication unit 250 and the effect processing unit 260. The reproduction control unit 230 obtains the reproduction time point and the number of times of duplication of the high-resolution audio data, and setting contents of effect processing from the metadata, and supplies the audio reproduction time point and the number of times of duplication to the duplication unit 250. Also, the reproduction control unit 230 supplies the setting contents of the effect processing to the effect processing unit 260.

The duplication unit 250 duplicates the audio data under the control of the reproduction control unit 230. Each time the audio data from the decoding unit 240 is supplied, the duplication unit 250 determines whether the reproduction time point coincides with the reproduction time point from the reproduction control unit 230. In a case of coincidence, the duplication unit 250 duplicates the audio data the number of times of duplication set by the reproduction control unit 230 and supplies the same to the effect processing unit 260. On the other hand, in a case where the reproduction time points do not coincide with each other, the duplication unit 250 supplies the audio data to the speaker 280 without duplicating the same.

The effect processing unit 260 executes different signal processing on each of the duplicated audio data under the control of the reproduction control unit 230. The effect processing unit 260 executes gain adjustment processing, equalizer processing and the like, and supplies the processed duplicated audio data to the speaker 280. The speaker 280 converts the audio data into physical vibration to reproduce audio.

Meanwhile, although it is configured such that the reproduction device 200 is provided outside the imaging device 100, a function of the reproduction device 200 may also be provided in the imaging device 100.

FIG. 21 is a view illustrating an example of a field to be set when MPEG4-AAC is used in the third embodiment. As illustrated in the drawing, in metadata 510 of the MPEG 4-AAC standards, for example, detailed setting data is stored in a data stream element (DSE) area 511.

FIG. 22 is a view illustrating an example of a field to be set when MPEG4-system is used in the third embodiment.

As illustrated in the drawing, in metadata 520 of the MPEG 4-system standards, for example, the detailed setting data is stored in an udta area 521.

FIG. 23 is a view illustrating an example of a field to be set when a HMMP file format is used in the third embodiment. As illustrated in the drawing, in metadata 530 of the HMMP standards, for example, the detailed setting data is stored in a uuid area 531.

Figure 24:
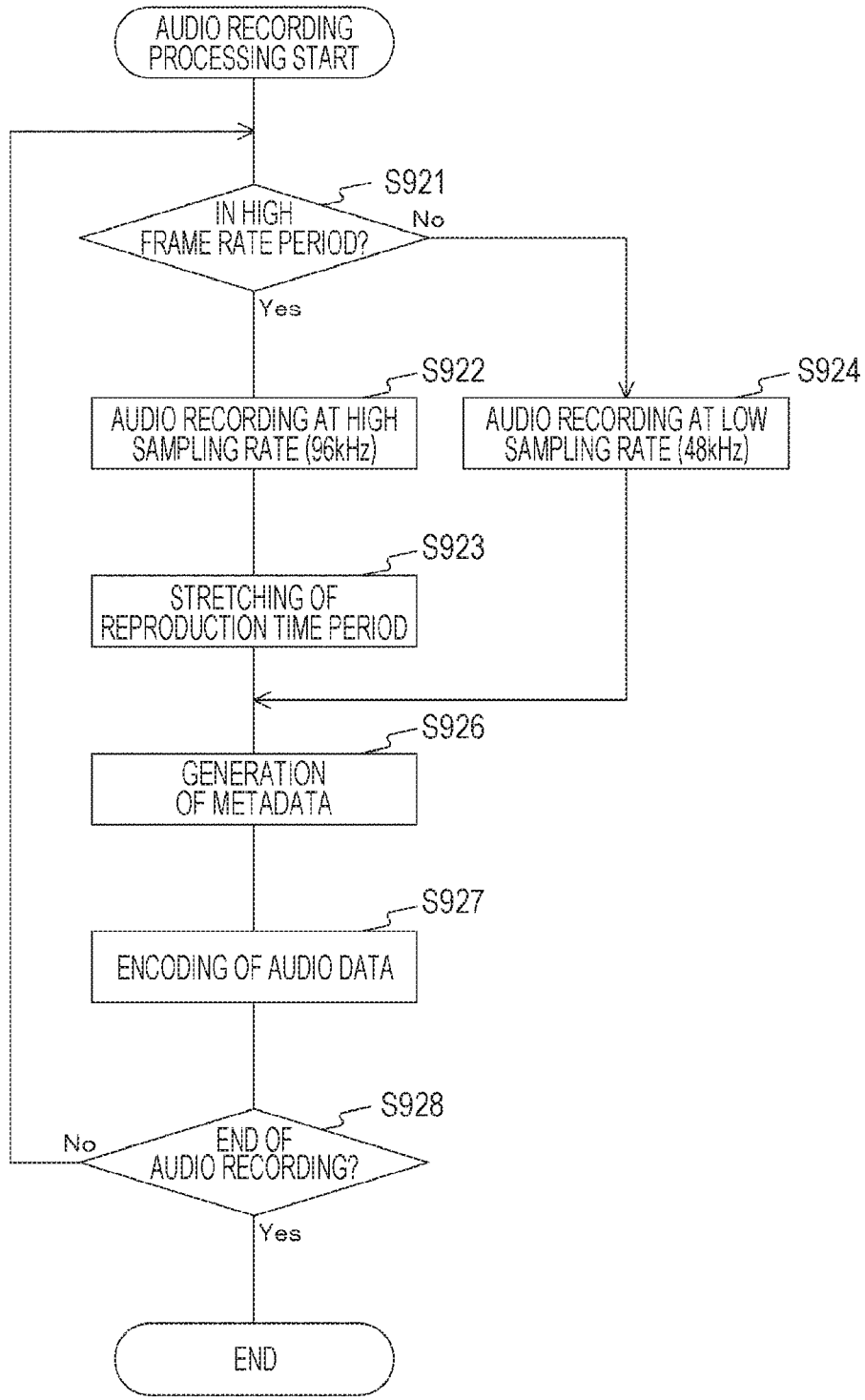
FIG. 24 is a flowchart illustrating an example of audio recording processing in the third embodiment.

FIG. 24 is a flowchart illustrating an example of audio recording processing in the third embodiment. The audio recording processing of the third embodiment is different from that of the first embodiment in further executing step S926.

After step S923 or S924, the imaging device 100 generates the metadata in which the setting contents are stored (step S926), and executes step S927 and subsequent steps.

Figure 25:
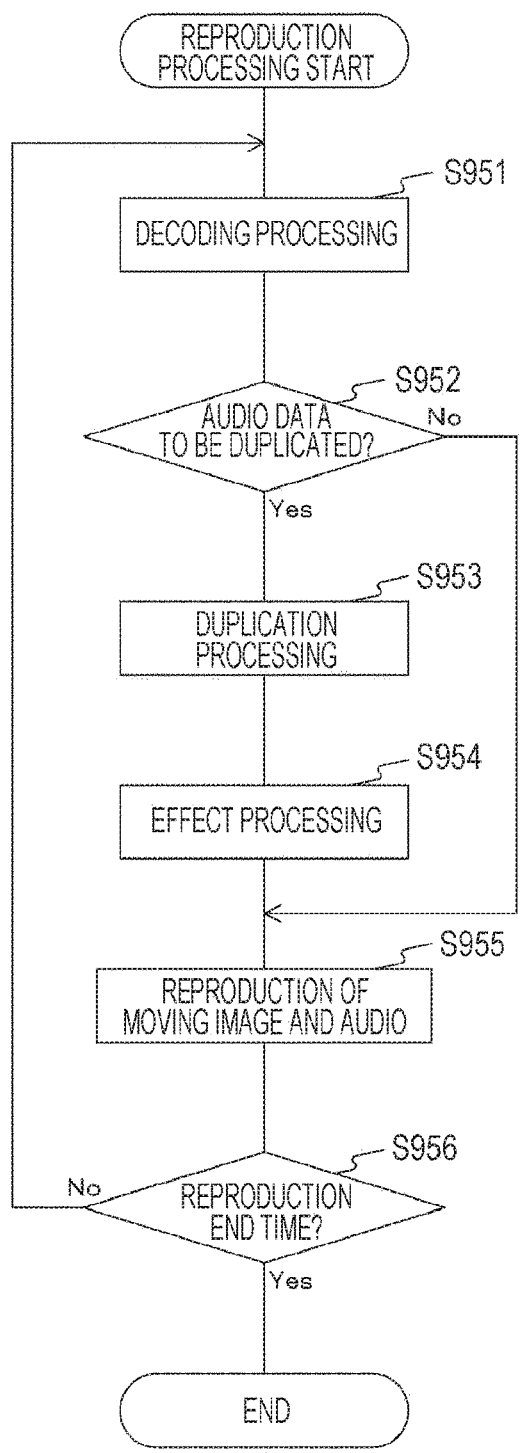
FIG. 25 is a flowchart illustrating an example of reproduction processing in the third embodiment.

FIG. 25 is a flowchart illustrating an example of reproduction processing in the third embodiment. This operation starts, for example, when operation for reproducing the stream (such as pressing of a reproduction button) is performed.

The reproduction device 200 performs decoding processing of decoding the encoded data (step S951), and refers to the metadata to determine whether the decoded audio data is the high-resolution audio data to be duplicated (step S952). In a case where this is the duplication target (step S952: Yes), the reproduction device 200 duplicates the high-resolution audio data (step S953) and executes the effect processing such as volume adjustment and equalizer processing (step S954).

In a case where this is not the duplication target (step S952: No) or after step S954, the reproduction device 200 reproduces the moving image and audio by the display unit and the speaker (step S955). Then, the reproduction device 200 determines whether it is reproduction end time (step S956). In a case where it is not the reproduction end time (step S956: No), the imaging device 100 repeats step S951 and subsequent steps. On the other hand, in a case where it is the reproduction end time (step S956: Yes), the reproduction device 200 ends the reproduction processing.

In this manner, according to the third embodiment of the present technology, since the reproduction device 200 performs the duplication processing of the high-resolution audio data and the like, there is no need for the imaging device 100 to duplicate the audio data at the time of recording, so that it is possible to decrease a data size required for recording the stream.

<4. Fourth Embodiment>

Although the imaging device 100 generates the metadata indicating the setting contents of the signal processing (the number of times of duplication and the like) in the above-described third embodiment, the setting contents may be changed according to operation of a user. An imaging system of a fourth embodiment is different from that of the third embodiment in changing setting contents such as the number of times of duplication according to operation of a user.

Figure 26:
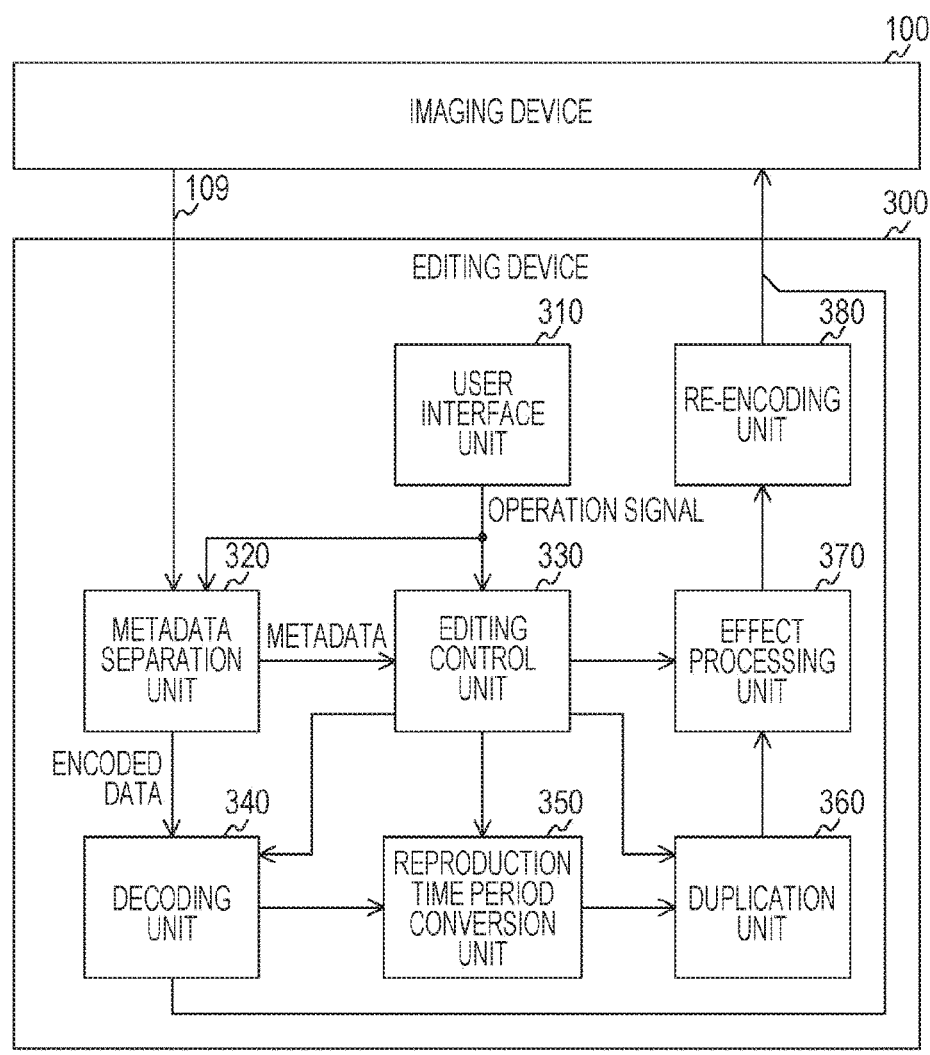
FIG. 26 is a block diagram illustrating a configuration example of an imaging system in a fourth embodiment.

FIG. 26 is a block diagram illustrating a configuration example of the imaging system in the fourth embodiment. The imaging system of the fourth embodiment is different from that of the third embodiment in including an editing device 300 in place of a reproduction device 200.

The editing device 300 is provided with a user interface unit 310, a metadata separation unit 320, an editing control unit 330, a decoding unit 340, a reproduction time period conversion unit 350, a duplication unit 360, an effect processing unit 370, and a re-encoding unit 380.

The user interface unit 310 generates an operation signal according to the operation of the user. For example, the operation signal instructing to change the setting contents in metadata is generated. The user interface unit 310 supplies the generated operation signal to the editing control unit 330.

The metadata separation unit 320 separates a stream into the metadata and encoded data according to the operation signal. The metadata separation unit 320 supplies the separated metadata to the editing control unit 330 and supplies the encoded data to the decoding unit 340.

The editing control unit 330 changes the setting contents of the metadata according to the operation signal. In a case where one of the number of times of duplication and a scale factor is changed by the user, the editing control unit 330 changes the other so as to satisfy expression 3. The editing control unit 330 supplies reproduction time point of a duplication target to the decoding unit 340. Also, the editing control unit 330 supplies the changed scale factor to the reproduction time period conversion unit 350, supplies the number of times of duplication to the duplication unit 360, and supplies setting contents of effect processing to the effect processing unit 370.

The decoding unit 340 decodes the encoded data. The decoding unit 340 supplies decoded high-resolution audio data to the reproduction time period conversion unit 350. Normal audio data and moving image data are supplied to the imaging device 100 without being decoded.

The reproduction time period conversion unit 350 stretches a reproduction time period of the audio data from the decoding unit 340 under the control of the editing control unit 330. The reproduction time period conversion unit 350 supplies the audio data the reproduction time period of which is stretched to the duplication unit 360. The duplication unit 360 duplicates the high-resolution audio data under the control of the editing control unit 330. The duplication unit 360 duplicates the high-resolution audio data and supplies the same to the effect processing unit 370.

Under the control of the editing control unit 330, the effect processing unit 370 executes signal processing such as volume level adjustment processing and equalizer processing. The effect processing unit 370 supplies the duplicated audio data after the signal processing to the re-encoding unit 380.

The re-encoding unit 380 re-encodes the high-resolution audio data. The re-encoding unit 380 supplies the stream generated by encoding to the imaging device 100.

In this manner, the user may further improve a reproduction quality by finely adjusting the reproduction time period and the number of times of duplication. For example, in a case where the user feels that a current reproduction speed is too slow for setting to duplicate "five" times while "doubling" the reproduction time period, the scale factor is changed to "1.5" and the like. When the scale factor is changed to "1.5", the editing device 300 changes the number of times of duplication using expression 3.

Meanwhile, although it is configured that the editing device 300 is provided outside the imaging device 100, each circuit in the editing device 300 may also be provided inside the imaging device 100.

Figure 27:
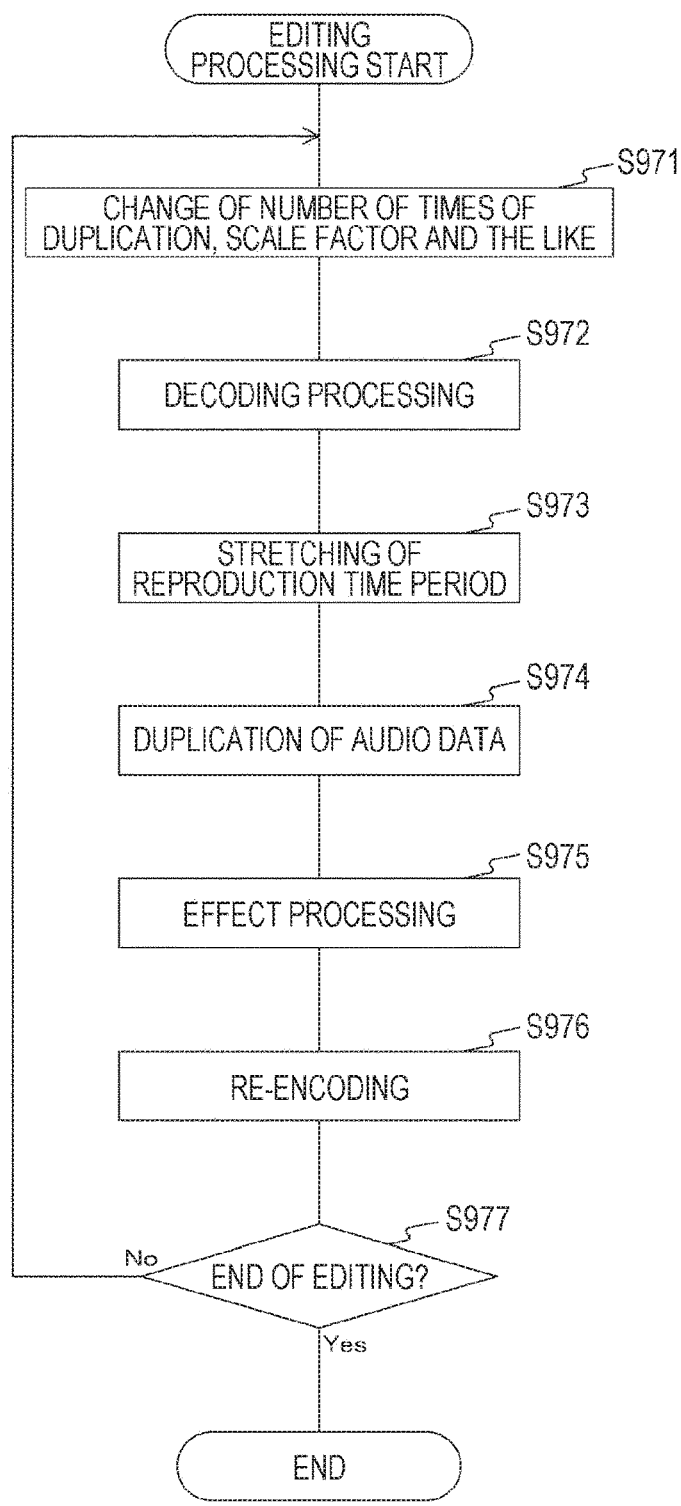
FIG. 27 is a flowchart illustrating an example of editing processing in the fourth embodiment.

FIG. 27 is a flowchart illustrating an example of editing processing in the fourth embodiment. This editing processing starts, for example, when an application for editing the metadata is executed.

The editing device 300 separates the metadata, and changes the number of times of duplication, scale factor and the like in the metadata according to the operation of the user (step S971). Also, the editing device 300 executes decoding processing of decoding the encoded data (step S972) and changes the reproduction time period of a sound signal to be duplicated (step S973). Then, the editing device 300 duplicates the high-resolution audio data the reproduction time period of which is changed (step S974) and executes the effect processing on each of the duplicated sound signals (step S975). The editing device 300 re-encodes the duplicated audio data (step S976) and determines whether operation for ending the editing is performed (step S977). In a case where the operation for ending the editing is not performed (step S977: No), the imaging device 100 repeats step S971 and subsequent steps. On the other hand, in a case where the operation for ending the editing is performed (step S977: Yes), the imaging device 100 ends the editing processing.

As described above, according to the fourth embodiment of the present technology, since the editing device 300 changes the setting such as the number of times of duplication and reproduction time period in the metadata according to the operation of the user, it is possible to further improve the reproduction quality by finely adjusting the number of times of duplication and reproduction time period.

<5. Fifth Embodiment>

In the first embodiment described above, the audio capturing unit 160 samples the normal audio data while switching the sampling rate by the sampling rate variable microphone 161. However, the audio capturing unit 160 may also re-sample high-resolution audio data sampled by a microphone a sampling rate of which is fixed to generate the normal audio data. An audio capturing unit 160 of a fifth embodiment is different from that of the first embodiment in re-sampling the high-resolution audio data to generate the normal audio data.

Figure 28:
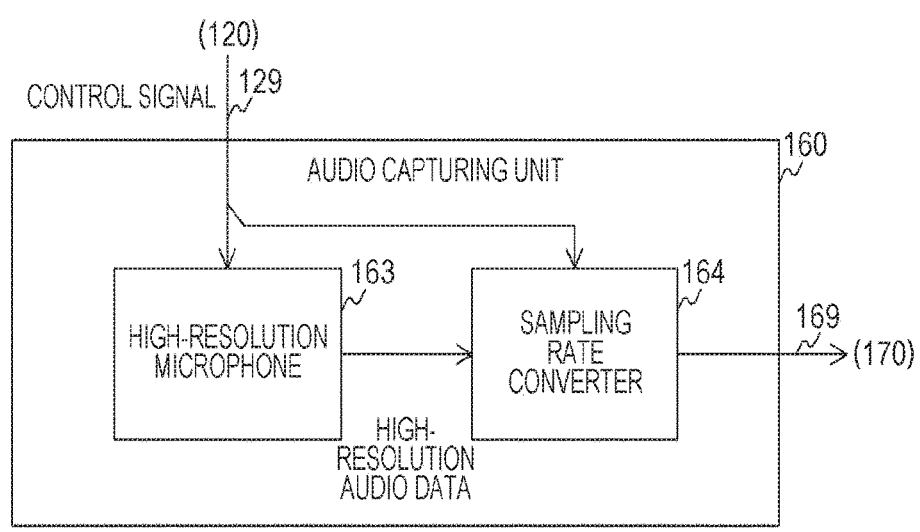
FIG. 28 is a block diagram illustrating a configuration example of an audio capturing unit in a fifth embodiment.

FIG. 28 is a block diagram illustrating a configuration example of the audio capturing unit 160 in the fifth embodiment. The audio capturing unit 160 of the fifth embodiment is different from that of the first embodiment in including a high-resolution microphone 163 and a sampling rate converter 164 in place of a sampling rate variable microphone 161.

The high-resolution microphone 163 samples audio at a sampling rate (such as 96 kilohertz) higher than a predetermined sampling rate (such as 48 kilohertz) according to a control signal to generate the high-resolution audio data. The high-resolution microphone 163 generates the high-resolution audio data over a period from recording start timing to recording end timing, and supplies the same to the sampling rate converter 164.

The sampling rate converter 164 re-samples the high-resolution audio data at the predetermined sampling rate (such as 48 kilohertz) outside a high frame rate period indicated by the control signal. The sampling rate converter 164 supplies the audio data after the sampling rate conversion to an audio processing unit 170 as the normal audio data. On the other hand, the high-resolution audio data in the high frame rate period is supplied to the audio processing unit 170 as-is.

Meanwhile, although a digital microphone which outputs digital audio data is provided as the high-resolution microphone 163, an analog microphone which outputs an analog sound signal may also be provided in place of this digital microphone. In this case, an AD converter which performs AD conversion on the sound signal from the analog microphone is further provided between the analog microphone and the sampling rate converter 164, and the AD converter samples at a high sampling rate.

Also, the sampling rate converter 164 may gradually convert step by step when converting the sampling rate. For example, over a constant time period from a start point of the high frame rate period, the sampling rate converter 164 gradually increases the sampling rate at the time of re-sampling. Also, the audio capturing unit 160 decreases the sampling rate little by little over a period from a time point a predetermined time period before an end time point of the high frame rate period to the end time point.

Also, the audio capturing unit 160 may add an equalizer processing unit on a subsequent stage of the sampling rate converter 164 in order to reduce a sense of discomfort of a portion where the sampling rate changes. The equalizer processing unit gradually adjusts a volume level of a high-frequency band a frequency of which is higher than a constant value step by step with a gain. For example, the equalizer processing unit gradually increases the volume level of the high-frequency band over a constant time period from the start time period of the high frame rate period. Also, the equalizer processing unit gradually decreases the volume level of the high-frequency band over a period from the time point a predetermined time period before the end time point of the high frame rate period to the end point.

Figure 29:
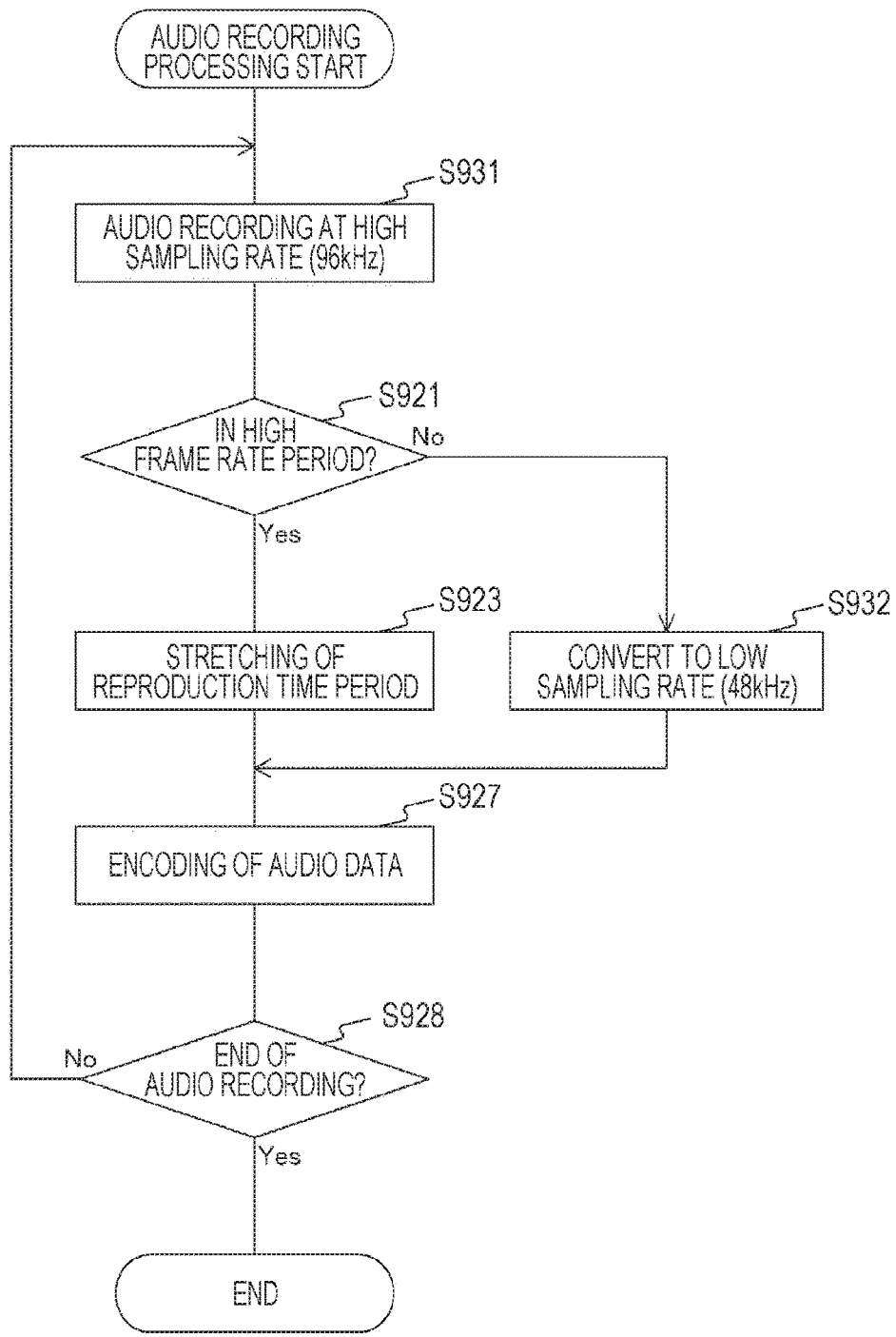
FIG. 29 is a flowchart illustrating an example of audio recording processing in the fifth embodiment.

FIG. 29 is a flowchart illustrating an example of audio recording processing in the fifth embodiment. The audio recording processing of the fifth embodiment is different from that of the first embodiment in executing steps S931 and S932 in place of steps S922 and S924.

When operation for starting image recording is performed, the imaging device 100 performs audio recording at a high sampling rate of 96 kilohertz (kHz) (step S931), and determines whether current time is in the high frame rate period (step S912). In a case where this is in the high frame rate period (step S921: Yes), the imaging device 100 converts the reproduction time period of the generated high-resolution audio data (step S923). On the other hand, in a case where this is not in the high frame rate period (step S921: No), the imaging device 100 converts the sampling rate to a low sampling rate of 48 kilohertz (kHz) (step S932). After step S923 or S932, the imaging device 100 encodes the audio data (step S927).

As described above, according to the fifth embodiment of the present technology, since the high-resolution audio data is re-sampled outside the high frame rate period to generate the normal audio data, it is possible to generate the normal audio data without using the sampling rate variable microphone 161.

<6. Sixth Embodiment>

The audio capturing unit 160 samples the normal audio data while switching the sampling rate with one sampling rate variable microphone 161 in the above-described first embodiment. However, the audio capturing unit 160 may also generate high-resolution audio data and normal audio data using two microphones having different sampling rates. An audio capturing unit 160 of a sixth embodiment is different from that of the first embodiment in generating the high-resolution audio data and normal audio data with two microphones having different sampling rates.

Figure 30:
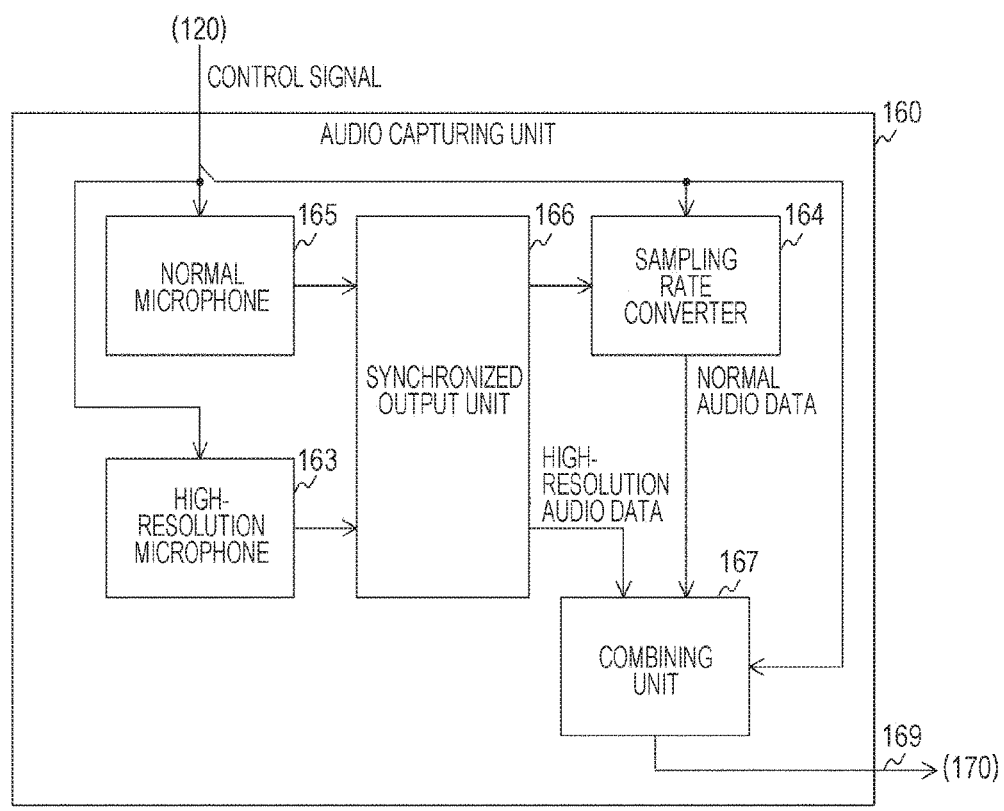
FIG. 30 is a block diagram illustrating a configuration example of an audio capturing unit in a sixth embodiment.

FIG. 30 is a block diagram illustrating a configuration example of the audio capturing unit 160 in the sixth embodiment. The audio capturing unit 160 of the sixth embodiment is provided with a high-resolution microphone 163, a normal microphone 165, a synchronized output unit 166, a sampling rate converter 164, and a combining unit 167.

The normal microphone 165 samples audio at a predetermined sampling rate (such as 48 kilohertz) to generate the normal audio data according to a control signal. The normal microphone 165 generates the normal audio data over a period from recording start timing to recording end timing and supplies the same to the synchronized output unit 166.

According to the control signal, the high-resolution microphone 163 samples the audio at a sampling rate (such as 96 kilohertz) higher than the predetermined sampling rate to generate the high-resolution audio data. The high-resolution microphone 163 generates the high-resolution audio data over the period from the recording start timing to the recording end timing and supplies the same to the synchronized output unit 166.

Meanwhile, although a digital microphone which outputs digital audio data is provided as the high-resolution microphone 163 and the normal microphone 165, it is also possible that one analog microphone which outputs an analog sound signal is provided in place of the digital microphones. In this case, two AD converters which perform AD conversion on the sound signal from the analog microphone are further provided, and these AD converters sample at different sampling rates.

The synchronized output unit 166 outputs the high-resolution audio data and the normal audio data in synchronization with a predetermined synchronization signal. The synchronized output unit 166 outputs the normal audio data to the sampling rate converter 164, and outputs the high-resolution audio data to the combining unit 167.

The sampling rate converter 164 converts the sampling rate of the normal audio data to a higher sampling rate as necessary. The sampling rate converter 164 supplies the converted normal audio data to the combining unit 167.

The combining unit 167 combines the normal audio data with the high-resolution audio data. The combining unit 167 sets a ratio of the high-resolution audio data to "0" outside a high frame rate period, and selects only the normal audio data to output. On the other hand, in the high frame rate period, the combining unit 167 outputs the audio data obtained by combining the normal audio data with the high-resolution audio data in a fade period, and this sets the ratio of the high-resolution audio data to "1" and selects the high-resolution audio data to output outside the fade period. Meanwhile, the combining unit 167 is an example of a selection unit recited in claims.

Herein, the fade period is formed by including a fade-in period and a fade-out period. The fade-in period is a period from start timing of the high frame rate period until a constant time period elapses. On the other hand, the fade-out period is a period from timing a predetermined time period before end timing of the high frame rate period to the end timing.

In the fade-in period, the combining unit 167 increases the ratio of the high-resolution audio data in the combination every time a unit time period shorter than the fade-in period elapses. As a result, a proportion of the high-resolution audio data gradually increases. On the other hand, in the fade-out period, the combining unit 167 decreases the ratio of the high-resolution audio data in the combination every time a unit time period shorter than the fade-out period elapses. As a result, the proportion of the high-resolution audio data gradually decreases. Processing of gradually changing the proportion of the data by fade-in and fade-out in this manner is called as cross-fade processing. By this cross-fade processing, it is possible to reduce a sense of discomfort in a portion in which it is switched from one of the normal audio data and the high-resolution audio data to the other.

Meanwhile, although the audio capturing unit 160 performs the cross-fade processing by the combining unit 167, the configuration is not limited to this. The audio capturing unit 160 may also be provided with a selector and the like in place of the combining unit 167 and switch the audio data by the selector to output without performing the cross-fade processing. In this case, for the purpose of reducing the sense of discomfort, an equalizer processing unit may be added to a subsequent stage of the selector, and the equalizer processing unit may gradually adjust a volume level of a high-frequency band step by step with a gain. For example, in a period corresponding to the fade-in period, the equalizer processing unit may gradually increase the volume level of the high-frequency band and gradually decrease the volume level of the high-frequency band in a period corresponding to the fade-out period.

Also, although the audio capturing unit 160 samples the audio using the two microphones, this may sample with three or more microphones. For example, three microphones with sampling rates of 48, 96 and 192 kilohertz (kHz) may be provided, and the combining unit 167 may combine them. For example, the combining unit 167 combines the audio of 48 kilohertz with the audio of 96 kilohertz and gradually increases a proportion of 96 kilohertz from a start time point in the fade-in period to a certain time point. Then, from the time point until an end time point of the fade-in period, the combining unit 167 combines the audio of 96 kilohertz with the audio of 192 kilohertz and gradually increases a proportion of 192 kilohertz. In the fade-out period, the combining unit 167 may perform processing as opposed to that in the fade-in period.

Figure 31:
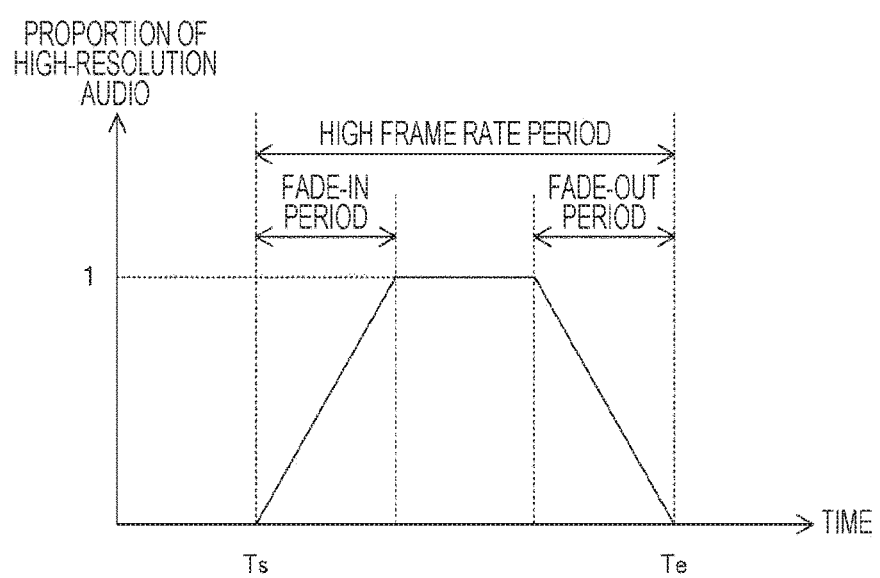
FIG. 31 is a graph illustrating an example of variation of a composition ratio in the sixth embodiment.

FIG. 31 is a graph illustrating an example of variation of a composition ratio in the sixth embodiment. In the drawing, the composition ratio of the high-resolution audio data is plotted along the ordinate and time is plotted along the abscissa.

As illustrated in the drawing, the composition ratio of the high-resolution frame rate is set to "0" outside the high frame rate period. By this composition ratio, the combining unit 167 selects the normal audio data to output.

In the fade-in period in the high frame rate period, the combining unit 167 gradually increases the ratio of the high-resolution audio data to combine. Also, in the fade-out period in the high frame rate period, the combining unit 167 gradually decreases the ratio of the high-resolution audio data to combine. Also, the ratio of the high-resolution audio data is set to "1" outside the fade period in the high frame rate period. By this composition ratio, the combining unit 167 selects the high-resolution audio data to output.

Figure 32:
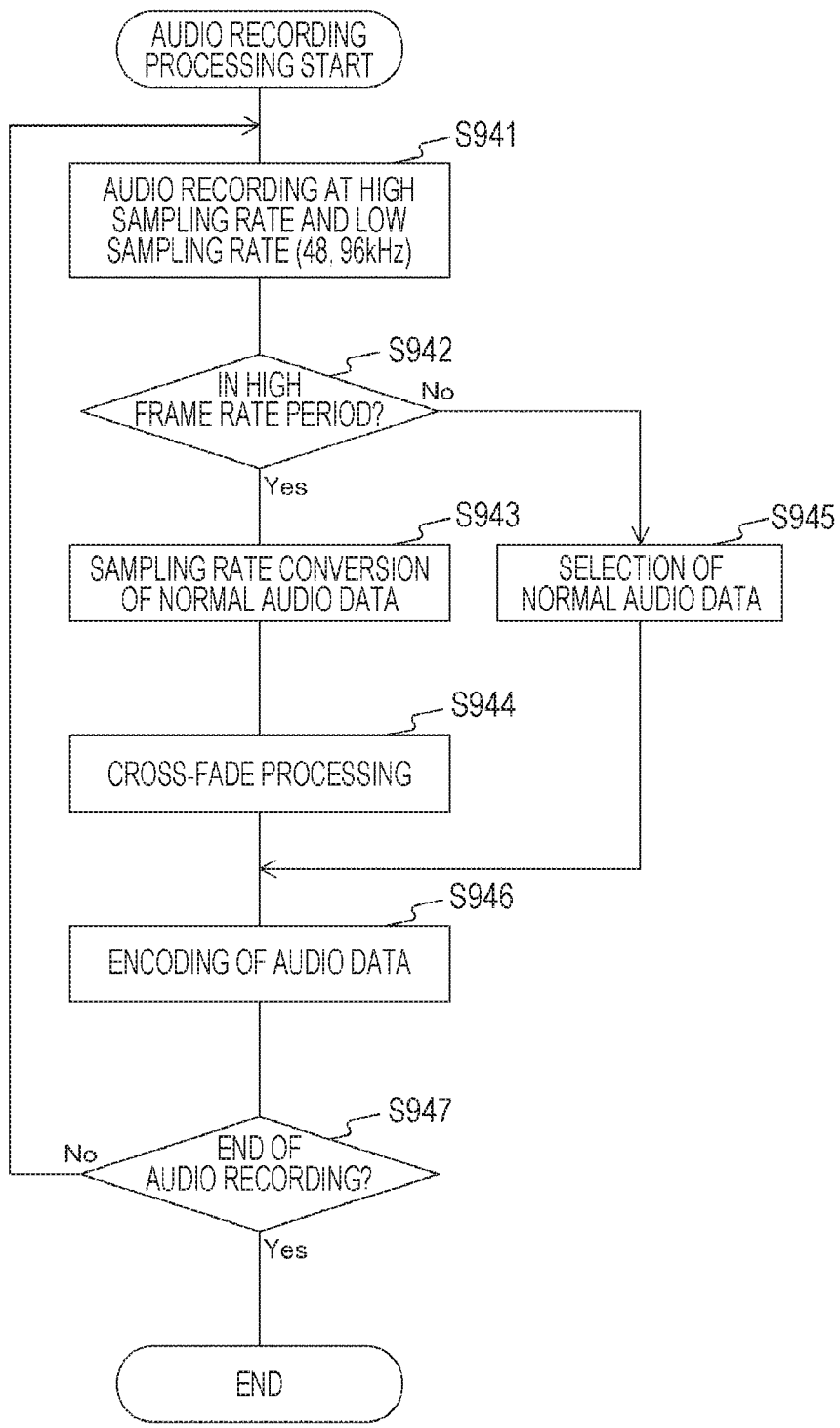
FIG. 32 is a flowchart illustrating an example of audio recording processing in the sixth embodiment.

FIG. 32 is a flowchart illustrating an example of audio recording processing in the sixth embodiment. An imaging device 100 first records audio at each of a high sampling rate (such as 96 kilohertz) and a low sampling rate (such as 48 kilohertz) (step S941). Then, the imaging device 100 determines whether current time is in the high frame rate period (step S942).

In a case where this is in the high frame rate period (step S942: Yes), the imaging device 100 converts the sampling rate of the normal audio data as necessary (step S943). Then, the imaging device 100 performs the cross-fade processing (step S944). On the other hand, in a case where this is outside the high frame rate period (step S942: No), the imaging device 100 selects the normal audio data (step S945).

After step S944 or S945, the imaging device 100 encodes the audio data (step S946), and determines whether operation for ending audio recording (such as pressing of a stop button) is performed (step S947). In a case where the operation for ending the audio recording is not performed (step S947: No), the imaging device 100 repeats step S941 and subsequent steps. On the other hand, in a case where the operation for ending the audio recording is performed (step S947: Yes), the imaging device 100 ends the audio recording processing.

As described above, according to the sixth embodiment of the present technology, since the imaging device 100 separately generates the high-resolution audio data and the normal audio data and selects one of them to output, it is possible to generate the audio data without using the sampling rate variable microphone 161.

Meanwhile, the above-described embodiments describe an example of embodying the present technology, and there is a correspondence relationship between matters in the embodiments and the matters specifying the invention in claims. Similarly, there is a correspondence relationship between the matters specifying the invention in claims and the matters in the embodiments of the present technology having the same names. However, the present technology is not limited to the embodiments and may be embodied with various modifications of the embodiment without departing from the spirit thereof.

Also, the procedures described in the above-described embodiments may be considered as a method including a series of procedures and may be considered as a program for allowing a computer to execute the series of procedures and a recording medium which stores the program. A compact disc (CD), a MiniDisc (MD), a digital versatile disc (DVD), a memory card, a Blu-ray™ Disc and the like may be used, for example, as the recording medium.

Meanwhile, the effects are not necessarily limited to the effects herein described and may be any effect described in the present disclosure.

Meanwhile, the present technology may also have a following configuration.

(1) An audio recording device including:

a sampling processing unit configured to perform processing of sampling audio in a predetermined period at a sampling rate higher than a predetermined sampling rate to generate audio data as high-resolution audio data, and processing of sampling audio outside the predetermined period at the predetermined sampling rate to generate audio data as normal audio data; and a reproduction time period conversion unit configured to stretch a reproduction time period of the high-resolution audio data.

(2) The audio recording device according to (1) described above, in which the sampling processing unit samples the audio at the predetermined sampling rate outside the predetermined period and switches the sampling rate to a sampling rate higher than the predetermined sampling rate to sample the audio in the predetermined period.

(3) The audio recording device according to (1) described above, in which the sampling processing unit is provided with a high-resolution microphone which samples the audio at a sampling rate higher than the predetermined sampling rate to generate the high-resolution audio data, and a sampling rate converter which re-samples the high-resolution audio data at the predetermined sampling rate to generate the normal audio data outside the predetermined period.

(4) The audio recording device according to (1), in which the sampling processing unit is provided with a high-resolution microphone which samples the audio at a sampling rate higher than the predetermined sampling rate to generate the high-resolution audio data, a normal microphone which samples the audio at the predetermined sampling rate to generate the normal audio data, and a selection unit which selects the high-resolution audio data to output in the predetermined period and selects the normal audio data to output outside the predetermined period.

(5) The audio recording device according to (4) described above, in which the selection unit performs combining processing of combining the normal audio data with the high-resolution audio data in a constant fade period in the predetermined period.

(6) The audio recording device according to (5) described above, in which the selection unit changes a proportion of the high-resolution audio data each time a unit time period shorter than the fade period elapses in the combining processing.

(7) The audio recording device according to any one of (1) to (6) described above, further including:

an imaging unit configured to image a plurality of frames at a frame rate higher than a predetermined frame rate; and a frame rate conversion unit configured to convert a frame rate of a frame imaged outside the predetermined period out of the plurality of frames to the predetermined frame rate.

(8) The audio recording device according to (7) described above, further including:

a control unit configured to set a period including predetermined timing as the predetermined period.

(9) The audio recording device according to (8) descried above, further including:

a scene change detection unit configured to detect scene change timing at which a scene changes out of the plurality of frames, in which the control unit sets a period including the scene change timing as the predetermined period.

(10) The audio recording device according to (8) or (9) described above, further including:

a sensor configured to detect a predetermined detection target, in which the control unit sets a period including timing at which the detection target is detected as the predetermined period.

(11) The audio recording device according to any one of (1) to (10) described above, further including:

a signal processing unit configured to execute predetermined signal processing on the high-resolution audio data the reproduction time period of which is stretched.

(12) The audio recording device according to (11) described above, in which the signal processing unit duplicates the high-resolution audio data.

(13) The audio recording device according to (11) or (12) described above, in which the signal processing unit adjusts a volume level of the high-resolution audio data with a predetermined gain.

(14) The audio recording device according to any one of (11) to (13) described above, in which the signal processing unit changes a frequency characteristic of the high-resolution audio data.

(15) An audio recording system including:

an audio recording device configured to perform processing of sampling audio in a predetermined period at a sampling rate higher than a predetermined sampling rate to generate audio data as high-resolution audio data, and processing of sampling audio outside the predetermined period at the predetermined sampling rate to generate audio data as normal audio data, and stretch a reproduction time period of the high-resolution audio data to generate metadata including setting information indicating signal processing which should be executed on the high-resolution audio data the reproduction time period of which is stretched; and a reproduction device configured to execute the signal processing according to the setting information and reproduce the high-resolution audio data on which the signal processing is executed and the normal audio data.

(16) The audio recording system according to (15) described above, in which a format of the metadata is MPEG4-AAC, and the audio recording device records the setting information in a data stream element (DSE) area of the metadata.

(17) The audio recording system according to (15) described above, in which a format of the metadata is MPEG4-system, and the audio recording device records the setting information in a udta area of the metadata.

(18) The audio recording system according to (15) described above in which a format of the metadata is home and mobile multimedia platform (HMMP), and the audio recording device records the setting information in a uuid area of the metadata.

(19) An audio recording system including:

an audio recording device configured to perform processing of sampling audio in a predetermined period at a sampling rate higher than a predetermined sampling rate to generate audio data as high-resolution audio data, and processing of sampling audio outside the predetermined period at the predetermined sampling rate to generate audio data as normal audio data, and stretch a reproduction time period of the high-resolution audio data to generate metadata including setting information indicating signal processing which should be executed on the high-resolution audio data the reproduction time period of which is stretched; and an editing device configured to change the setting information to execute the signal processing indicated by the changed setting information.

(20) An audio recording method including:

a sampling procedure to perform processing of sampling audio in a predetermined period at a sampling rate higher than a predetermined sampling rate to generate audio data as high-resolution audio data, and processing of sampling audio outside the predetermined period at the predetermined sampling rate to generate audio data as normal audio data; and a reproduction time period conversion procedure to stretch a reproduction time period of the high-resolution audio data.

REFERENCE SIGNS LIST

100 Imaging device
101 Audio recording device
110, 210, 310 User interface unit
115 Sensor
120, 125 Control unit
130 Moving image capturing unit
131 Imaging unit
132, 171 Buffer
133 Scene change detection unit
134 Frame rate conversion unit
140 Moving image processing unit
150 Recording format conversion unit
160 Audio capturing unit
161 Sampling rate variable microphone
162 Additional information generation unit
163 High-resolution microphone
164 Sampling rate converter
165 Normal microphone
166 Synchronized output unit
167 Combining unit
170 Audio processing unit
172, 350 Reproduction time period conversion unit
173, 250, 360 Duplication unit
174, 260, 370 Effect processing unit
175 Gain adjustment unit
176 Equalizer processing unit
177 Audio encoding unit
180 Recording unit
190 Metadata generation unit
200 Reproduction device
220, 320 Metadata separation unit
230 Reproduction control unit
240, 340 Decoding unit
270 Display unit
280 Speaker
300 Editing device
330 Editing control unit
380 Re-encoding unit

The invention claimed is:

1. An audio recording device, comprising:
 a sampling processing unit configured to:
  sample audio in a determined period at a sampling rate higher than a determined sampling rate;
  generate first audio data as high-resolution audio data based on the audio sampled at the sampling rate;
  sample the audio outside the determined period at the determined sampling rate; and
  generate second audio data as normal audio data based on the audio sampled at the determined sampling rate; and
 a reproduction time period conversion unit configured to stretch a reproduction time period of the high-resolution audio data.

2. The audio recording device according to claim 1, wherein the sampling processing unit is further configured to switch to the sampling rate higher than the determined sampling rate to sample the audio in the determined period.

3. The audio recording device according to claim 1, wherein the sampling processing unit comprises:
 a high-resolution microphone configured to sample the audio at the sampling rate higher than the determined sampling rate to generate the high-resolution audio data, and
 a sampling rate converter configured to re-sample the high-resolution audio data at the determined sampling rate to generate the normal audio data outside the determined period.

4. The audio recording device according to claim 1, wherein the sampling processing unit comprises:
 a high-resolution microphone configured to sample the audio at the sampling rate higher than the determined sampling rate to generate the high-resolution audio data,
 a normal microphone configured to sample the audio at the determined sampling rate to generate the normal audio data, and a selection unit configured to select the high-resolution audio data to output in the determined period and select the normal audio data to output outside the determined period.

5. The audio recording device according to claim 4, wherein the selection unit is further configured to execute a combining process in which the normal audio data is combined with the high-resolution audio data in a constant fade period in the determined period.

6. The audio recording device according to claim 5, wherein the selection unit is further configured to change a proportion of the high-resolution audio data each time a unit time period shorter than the constant fade period elapses in the combining process.

7. The audio recording device according to claim 1, further comprising:
an imaging unit configured to image a plurality of frames at a first frame rate higher than a determined frame rate; and
a frame rate conversion unit configured to convert a second frame rate of a frame imaged outside the determined period of the plurality of frames to the determined frame rate.

8. The audio recording device according to claim 7, further comprising a control unit configured to set a first period including determined timing as the determined period.

9. The audio recording device according to claim 8, further comprising a scene change detection unit configured to detect a scene change timing at which a scene changes out of the plurality of frames, wherein the control unit is further configured to set a second period including the scene change timing as the determined period.

10. The audio recording device according to claim 8, further comprising a sensor configured to detect a determined detection target, wherein the control unit is further configured to set a second period including a timing at which the determined detection target is detected as the determined period.

11. The audio recording device according to claim 1, further comprising a signal processing unit configured to execute a determined signal process on the high-resolution audio data that has the stretched reproduction time period.

12. The audio recording device according to claim 11, wherein the signal processing unit is further configured to duplicate the high-resolution audio data.

13. The audio recording device according to claim 11, wherein the signal processing unit is further configured to adjust a volume level of the high-resolution audio data with a determined gain.

14. The audio recording device according to claim 11, wherein the signal processing unit is further configured to change a frequency characteristic of the high-resolution audio data.

15. An audio recording system, comprising:
an audio recording device configured to:
sample audio in a determined period at a sampling rate higher than a determined sampling rate;
generate first audio data as high-resolution audio data based on the audio sampled at the sampling rate;
sample the audio outside the determined period at the determined sampling rate;
generate second audio data as normal audio data based on the audio sampled at the determined sampling rate;
stretch a reproduction time period of the high-resolution audio data; and
generate metadata that includes setting information based on the stretched reproduction time period, wherein the setting information indicates a signal process to be executed on the high-resolution audio data that has the stretched reproduction time period; and
a reproduction device configured to:
execute the signal process indicated by the setting information on the high-resolution audio data; and
reproduce the high-resolution audio data and the normal audio data based on the execution of the signal process.

16. The audio recording system according to claim 15, wherein a format of the metadata is MPEG4-AAC, and the audio recording device is further configured to record the setting information in a data stream element (DSE) area of the metadata.

17. The audio recording system according to claim 15, wherein a format of the metadata is MPEG4-system, and the audio recording device is further configured to record the setting information in a udta area of the metadata.

18. The audio recording system according to claim 15, wherein a format of the metadata is home and mobile multimedia platform (HMMP), and the audio recording device is further configured to record the setting information in a uuid area of the metadata.

19. An audio recording system, comprising:
an audio recording device configured to:
sample audio in a determined period at a sampling rate higher than a determined sampling rate;
generate first audio data as high-resolution audio data based on the audio sampled at the sampling rate;
sample the audio outside the determined period at the determined sampling rate;
generate second audio data as normal audio data based on the audio sampled at the determined sampling rate;
stretch a reproduction time period of the high-resolution audio data; and
generate metadata that includes setting information based on the stretched reproduction time period, wherein the setting information indicates a signal process to be executed on the high-resolution audio data that has the stretched reproduction time period; and
an editing device configured to change the setting information to execute the signal process indicated by the changed setting information.

20. An audio recording method, comprising:
sampling audio in a determined period at a sampling rate higher than a determined sampling rate;
generating first audio data as high-resolution audio data based on the audio sampled at the sampling rate;
sampling the audio outside the determined period at the determined sampling rate;
generating second audio data as normal audio data based on the audio sampled at the determined sampling rate; and
stretching a reproduction time period of the high-resolution audio data.

* * * * *